(12) United States Patent
Chandra et al.

(10) Patent No.: US 10,145,008 B2
(45) Date of Patent: Dec. 4, 2018

(54) COMPOSITIONS AND METHODS USING SAME FOR CARBON DOPED SILICON CONTAINING FILMS

(71) Applicant: VERSUM MATERIALS US, LLC, Tempe, AZ (US)

(72) Inventors: Haripin Chandra, San Marcos, CA (US); Kirk Scott Cuthill, Vista, CA (US); Anupama Mallikarjunan, San Marcos, CA (US); Xinjian Lei, Vista, CA (US); Matthew R. MacDonald, Laguna Niguel, CA (US); Manchao Xiao, San Diego, CA (US); Madhukar Bhaskara Rao, Carlsbad, CA (US); Jianheng Li, Santa Clara, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/548,884

(22) PCT Filed: Feb. 4, 2016

(86) PCT No.: PCT/US2016/016514
§ 371 (c)(1),
(2) Date: Aug. 4, 2017

(87) PCT Pub. No.: WO2016/126911
PCT Pub. Date: Aug. 11, 2016

(65) Prior Publication Data
US 2018/0023192 A1    Jan. 25, 2018

Related U.S. Application Data

(60) Provisional application No. 62/113,024, filed on Feb. 6, 2015, provisional application No. 62/142,546, filed on Apr. 3, 2015.

(51) Int. Cl.
*C23C 16/40* (2006.01)
*C23C 16/34* (2006.01)
(Continued)

(52) U.S. Cl.
CPC .......... *C23C 16/401* (2013.01); *C23C 16/345* (2013.01); *C23C 16/36* (2013.01);
(Continued)

(58) Field of Classification Search
CPC ......... H01L 21/02126; H01L 21/02351; H01L 21/02354; H01L 21/0228; H01L 21/02211;
(Continued)

(56) References Cited

U.S. PATENT DOCUMENTS

| | | | |
|---|---|---|---|
| 8,575,033 B2 | 11/2013 | Weidman et al. | |
| 2011/0077364 A1* | 3/2011 | Tazaki | C08G 77/50 525/477 |

(Continued)

FOREIGN PATENT DOCUMENTS

WO      2014/134476      9/2014

OTHER PUBLICATIONS

International Search Report and Written Opinion for counterpart international patent application No. PCT/US2016/016514 dated Oct. 24, 2016 by the European Patent Office (EPO) in its capacity as International Searching Authority.
(Continued)

*Primary Examiner* — Jasmine Clark
(74) *Attorney, Agent, or Firm* — Stradley Ronon Stevens & Young, LLP

(57) ABSTRACT

Described herein are compositions and methods using same for forming a silicon-containing film such as, without limitation, a carbon doped silicon oxide film, a carbon doped silicon nitride, a carbon doped silicon oxynitride film in a
(Continued)

deposition process. In one aspect, the composition comprises at least cyclic carbosilane having at least one Si—C—Si linkage and at least one anchoring group selected from a halide atom, an amino group, and combinations thereof.

20 Claims, 5 Drawing Sheets

(51) Int. Cl.
*C23C 16/455* (2006.01)
*C23C 16/56* (2006.01)
*H01L 21/02* (2006.01)
*C23C 16/36* (2006.01)

(52) U.S. Cl.
CPC ...... *C23C 16/402* (2013.01); *C23C 16/45536* (2013.01); *C23C 16/56* (2013.01); *H01L 21/0228* (2013.01); *H01L 21/0234* (2013.01); *H01L 21/02126* (2013.01); *H01L 21/02211* (2013.01); *H01L 21/02326* (2013.01); *H01L 21/02348* (2013.01); *H01L 21/02351* (2013.01); *H01L 21/02354* (2013.01)

(58) Field of Classification Search
CPC ........... H01L 21/0234; H01L 21/02348; C23C 16/401; C23C 16/345; C23C 16/36; C23C 16/45536; C23C 16/56
See application file for complete search history.

(56) References Cited

U.S. PATENT DOCUMENTS

| | | |
|---|---|---|
| 2011/0195582 A1 | 8/2011 | Zhou |
| 2012/0122302 A1 | 5/2012 | Weidman et al. |
| 2013/0224964 A1 | 8/2013 | Fukazawa et al. |
| 2013/0288485 A1 | 10/2013 | Liang et al. |
| 2014/0051264 A1 | 2/2014 | Mallick et al. |
| 2014/0302688 A1 | 10/2014 | Underwood et al. |
| 2014/0302690 A1 | 10/2014 | Underwood et al. |

OTHER PUBLICATIONS

Fritz and Matern, "Bildung siliciumorganischer Verbindungen. 66. [1] ($H_2Si$—$CH_2$)$_2$ and Si-substituierte Derivate" Z. anorg. allg. Chem. vol. 426, No. 1, pp. 28-42—Sep. 1, 1976.
Han Zhou and Stacey F. Bent, "Highly Stable Ultrathin Carbosiloxane Films by Molecular Layer Deposition" Journal of Physical Chemistry C, No. 117, pp. 19967-19973, 2013.

* cited by examiner

COMPOSITIONS AND METHODS USING SAME FOR CARBON DOPED SILICON CONTAINING FILMS

CROSS-REFERENCE TO RELATED APPLICATIONS

This application is a U.S. National Phase filing of international patent application number PCT/US2016/016514 that was filed on Feb. 4, 2016 that claims the priority benefit of U.S. Provisional Application Nos. 62/113,024 and 62/142,546, filed Feb. 6, 2015 and filed Apr. 3, 2015, respectfully. The disclosures of these applications are hereby incorporated by reference in their entirety.

BACKGROUND OF THE INVENTION

Described herein is a composition and method for the fabrication of an electronic device. More specifically, described herein are compounds, and compositions and methods comprising same, for the deposition of a silicon-containing film such as, without limitation, a carbon doped silicon oxide, a carbon doped silicon nitride, a carbon doped silicon oxynitride, or a silicon carbide film.

There is a need in the art to provide a composition and method using same for depositing high carbon content (e.g., a carbon content of about 10 atomic % or greater as measured by X-ray photoelectron spectroscopy (XPS)) silicon-containing films for certain applications within the electronics industry.

U.S. Pat. No. 8,575,033 describes methods for deposition of silicon carbide films on a substrate surface. The methods include the use of vapor phase carbosilane precursors and may employ plasma enhanced atomic layer deposition processes.

US Publ. No. 2013/0224964 teaches a method of forming a dielectric film having Si—C bonds on a semiconductor substrate by atomic layer deposition (ALD), includes: (i) adsorbing a precursor on a surface of a substrate; (ii) reacting the adsorbed precursor and a reactant gas on the surface; and (iii) repeating steps (i) and (ii) to form a dielectric film having at least Si—C bonds on the substrate.

US Publ. No. 2014/302688 describes a method for forming a dielectric layer on a patterned substrate that may include combining a silicon-and-carbon-containing precursor and a radical oxygen precursor in a plasma free substrate processing region within a chemical vapor deposition chamber. The silicon-and-carbon-containing precursor and the radical oxygen precursor react to deposit the flowable silicon-carbon-oxygen layer on the patterned substrate.

U. S. Publ. No. 2014/302690 describes methods for forming a low-k dielectric material on a substrate. The methods may include the steps of producing a radical precursor by flowing an unexcited precursor into a remote plasma region, and reacting the radical precursor with a gas-phase silicon precursor to deposit a flowable film on the substrate. The gas-phase silicon precursor may include at least one silicon-and-oxygen containing compound and at least one silicon-and-carbon linker. The flowable film may be cured to form the low-k dielectric material.

US Publ. No. 2014/051264 describes methods of depositing initially flowable dielectric films on substrates. The methods include introducing silicon-containing precursor to a deposition chamber that contains the substrate. The methods further include generating at least one excited precursor, such as radical nitrogen or oxygen precursor, with a remote plasma system located outside the deposition chamber. The excited precursor is also introduced to the deposition chamber, where it reacts with the silicon-containing precursor in a reaction zone deposits the initially flowable film on the substrate. The flowable film may be treated in, for example, a steam environment to form a silicon oxide film.

PCT Appl. No. WO14134476A1 describes methods for the deposition of films comprising SiCN and SiCON. Certain methods involve exposing a substrate surface to a first and second precursor, the first precursor having a formula $(X_yH_{3-y}Si)zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5, and the second precursor comprising a reducing amine. Certain methods also comprise exposure of the substrate surface to an oxygen source to provide a film comprising SiCON.

The reference entitled "Highly Stable Ultrathin Carbosiloxane Films by Molecular Layer Deposition", Han, Z. et al., Journal of Physical Chemistry C, 2013, 117, 19967 teaches growing carbosiloxane film using 1,2-bis[(dimethylamino)dimethylsilyl]ethane and ozone. Thermal stability shows film is stable up to 40° C. with little thickness loss at 60° C.

BRIEF SUMMARY OF THE INVENTION

The composition and method described herein overcome the problems of the prior art by providing a composition or formulation for depositing a silicon-containing film forming having one or more of the following properties: an etch rate of about 0.20 Angstroms/second (Å/s) or less as measured in dilute hydrofluoric (HF) (e.g., 1:99 49% HF and DI water bath) and a carbon content of about 10 atomic weight percent (at. %) or greater as measured by X-ray photospectrometry (XPS). In one particular embodiment, the composition described herein may be used in a method to deposit a carbon doped, silicon oxide film using a thermal atomic layer deposition (ALD) process.

In one aspect, the composition for depositing a silicon-containing film comprises at least one cyclic carbosilane precursor compound having the following Formulae I and II and at least one anchoring group:

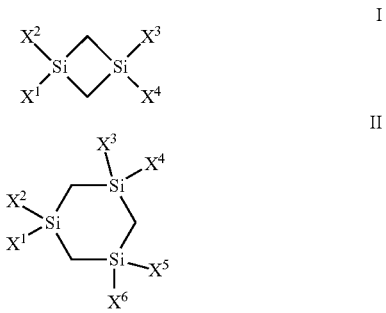

wherein $X^1$, $X^2$, $X^3$, $X^4$, $X^5$, and $X^6$ are each independently chosen from a hydrogen atom; a halide atom selected from F, Cl, Br, and I; an amino group having the formula $NR^1R^2$ wherein $R^1$ and $R^2$ are independently selected from the group consisting of a hydrogen atom, a $C_1$ to $C_{10}$ linear alkyl group; a $C_3$ to $C_{10}$ branched alkyl group; a $C_3$ to $C_{10}$ cyclic alkyl group; a $C_3$ to $C_{10}$ alkenyl group; a $C_4$ to $C_{10}$ aryl group; and a $C_4$ to $C_{10}$ heterocyclic group. In some embodiments of Formula I, II, or both I and II, any one or more of substituents $X^1$, $X^2$, $X^3$, $X^4$, $X^5$, and $X^6$ are linked to form a substituted or unsubstituted, saturated or unsaturated, cyclic group. In one particular embodiment of Formula I, II, or both I and II, any one or more of substituents $X^1$, $X^2$, $X^3$, $X^4$, $X^5$, and $X^6$ is either a halide atom or an amino group described above. In certain embodiments of Formula II, $X^1$, $X^2$, $X^3$, $X^4$, $X^5$, and $X^6$ cannot be all amino groups. In certain embodiments of Formula I or II, $R^1$ and $R^2$ in the amino group having the formula $NR^1R^2$ are linked together to form a ring. In one particular embodiment, $R^1$ and $R^2$ are selected from a linear or a branched $C_3$ to $C_6$ alkyl group and are linked to form a cyclic ring. In alternative embodiments of Formulae I or II having an amino group, $R^1$ and $R^2$ are not linked together to form a ring. In other embodiments of Formulae I and II having an amino group, $R^1$ and $R^2$ are different.

In certain embodiments of Formula I and II, the composition for forming a silicon-containing film comprises at least one cyclic halocarbosilane compound wherein at least one of the substituents $X^1$, $X^2$, $X^3$, $X^4$, $X^5$, $X^6$ is a halide atom selected from F, Cl, Br, and I as the anchoring group, and none of the substituents $X^1$, $X^2$, $X^3$, $X^4$, $X^5$, $X^6$ are amino groups. Exemplary cyclic halocarbosilanes include, but are not limited to, 1-chloro-1,3-disilacyclobutane, 1-bromo-1,3-disilacyclobutane, 1-iodo-1,3-disilacyclobutane, 1,3-dichloro-1,3-disilacyclobutane, 1,3-dibromo-1,3-disilacyclobutane, 1,3-diiodo-1,3-disilacyclobutane, 1,1-dichloro-1,3-disilacyclobutane, 1,1-dibromo-1,3-disilacyclobutane, 1,1-diiodo-1,3-disilacyclobutane, 1,1,3,3-tetrachloro-1,3-disilacyclobutane, 1,1,3,3-tetrabromo-1,3-disilacyclobutane, 1,1,3,3-tetraiodo-1,3-disilacyclobutane, 1,3-dichloro-1,3-dimethyl-1,3-disilacyclobutane, 1,1,3,3,5,5-hexachloro-1,3,5-trisilacyclohexane, 1,1,3,3-tetrachloro-1,3,5-trisilacyclohexane, and 1,3,5-trichloro-1,3,5-trisilacyclohexane.

In certain embodiments of Formula I and II, the composition for forming a silicon-containing film comprises at least one cyclic haloaminocarbosilane compound wherein at least one of the substituents $X^1$, $X^2$, $X^3$, $X^4$, $X^5$, $X^6$ is a halide atom selected from F, Cl, Br, and I, and at least one of the substituents $X^1$, $X^2$, $X^3$, $X^4$, $X^5$, $X^6$ is an amino group as the anchoring group. Exemplary cyclic haloaminocarbosilane compounds include, but are not limited to, 1,3-bis(dimethylamino)-1,3-dichloro-1,3-disilacyclobutane, 1,3-bis(diethylamino)-1,3-dichloro-1,3-disilacyclobutane, and 1-(dimethylamino)-1,3,3-trichloro-1,3-disilacyclobutane.

In certain embodiments of Formula I and II, the composition for forming a silicon-containing film comprises at least one cyclic aminocarbosilane compound comprising at least one of the substituents $X^1$, $X^2$, $X^3$, $X^4$, $X^5$, $X^6$ is a an amino group as the anchoring group, and none of the substituents $X^1$, $X^2$, $X^3$, $X^4$, $X^5$, $X^6$ is a halide atom. Exemplary cyclic aminocarbosilanes include, but are not limited to, 1,1,3,3-tetrakis(methylamino)-1,3-disilacyclobutane, 1,1,3,3-tetrakis(dimethylamino)-1,3-disilacyclobutane, 1,3-bis(dimethylamino)-1,3-dimethyl-1,3-disilacyclobutane, 1,3-bis(methylamino)-1,3-dimethyl-1,3-disilacyclobutane, and 1,3-bis(iso-propylamino)-1,3-dimethyl-1,3-disilacyclobutane.

In another aspect, there is provided a method for depositing a film selected from a carbon-doped silicon oxide film and a carbon-doped silicon oxynitride film onto at least a surface of a substrate comprising:

placing the substrate into a reactor;

heating the reactor to one or more temperatures ranging from about 25° C. to about 700° C.;

introducing into the reactor a precursor comprising at least one compound selected from a cyclic halocarbosilane compound, a cyclic haloaminocarbosilane compound, and combinations thereof;

introducing into the reactor a nitrogen source to react with at least a portion of the precursor to form a carbon doped silicon nitride film; and treating the carbon doped silicon nitride film with an oxygen source at one or more temperatures ranging from about 25° C. to 1000° C. or from about 100° to 400° C. under conditions sufficient to convert the carbon doped silicon nitride film into the film. In certain embodiments, the carbon doped silicon oxide film or the carbon doped silicon oxynitride film has a carbon content of about 10 atomic weight percent (at. %) or greater as measured by XPS and an etch rate of about 0.20 Å/s or less in dilute HF.

DETAILED DESCRIPTION OF THE INVENTION

Figure 1:
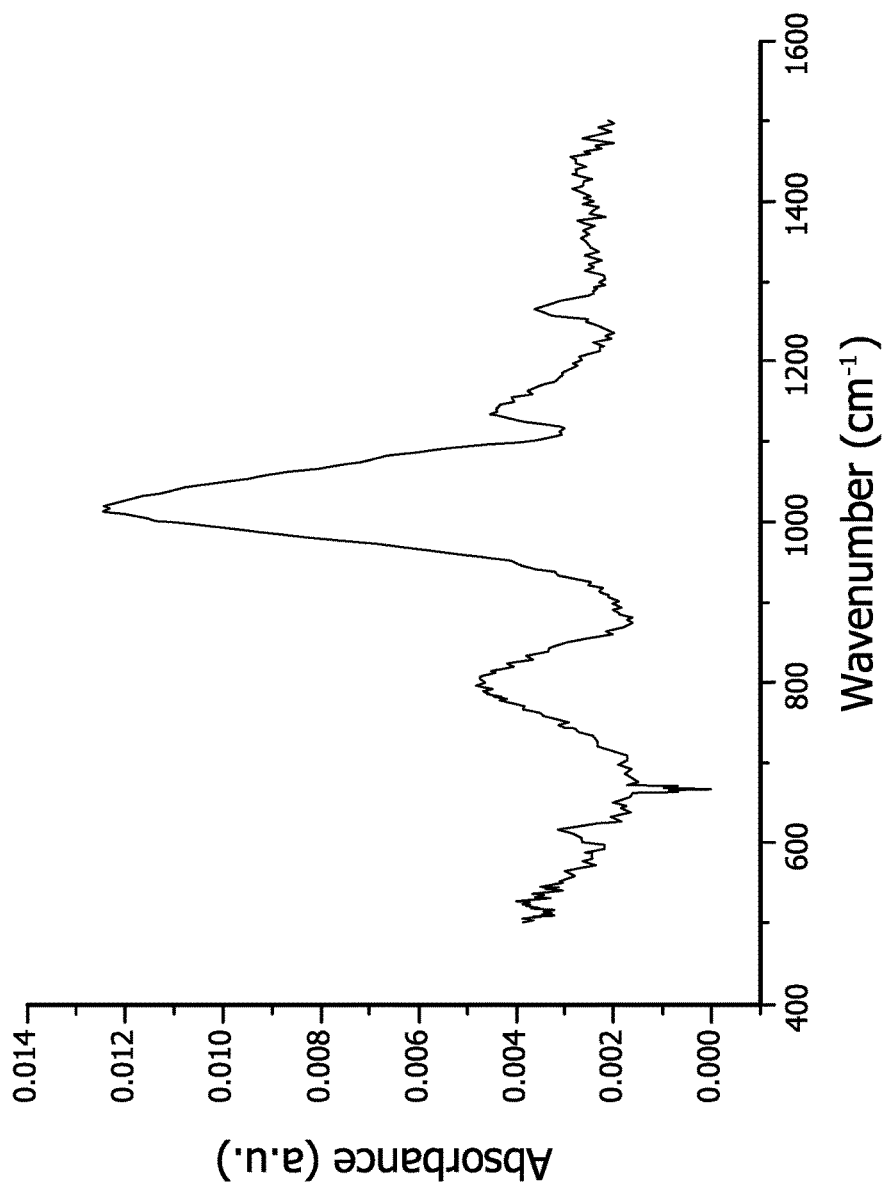
FIG. 1 provides the Fourier Transform Infrared Spectroscopy (FTIR) spectra of a film deposited using the precursor, 1,3-dichloro-1,3-(dimethyl)amino-1,3-disilacyclobutane, as described in Example 11.

Described herein are cyclic carbosilane precursor compounds, and compositions and methods comprising same, to deposit a carbon doped (e.g., having a carbon content of about 10 at. % or greater as measured by XPS), silicon-containing film via a deposition process such as, without limitation, a thermal atomic layer deposition process. The film deposited using the composition and method described herein exhibits an extremely low etch rate (e.g., about 0.20 Å/s or less or about 0.15 Å/s or less in dilute HF), while exhibiting variability in other tunable properties such as, without limitation, density, dielectric constant, refractive index, and elemental composition.

In certain embodiments, the cyclic carbosilane precursors described herein, and methods using same, impart one or more of described features in the following manner. First, the as-deposited, reactive carbon-doped silicon nitride film is formed using the cyclic carbosilane precursors comprising a Si—C—Si linkage and a nitrogen source. It is believed that the Si—C—Si linkage from the cyclic carbosilane precursor remains in the resulting as-deposited film and provides a high carbon content of at least 10 at. % or greater as measured by XPS. Second, when exposing the as-deposited film to an oxygen source, such as water, either intermittently during the deposition process, as a post-deposition treatment, or a combination thereof, at least a portion or all of the nitrogen content in the film is converted to oxygen to provide a film selected from a carbon-doped silicon oxide or a carbon-doped silicon oxynitride film. The nitrogen in the as-deposited film is released as one or more nitrogen-containing by-products such as ammonia or an amine group. In this or other embodiments, the final film is porous and has a density of about 1.7 grams/cubic centimeter (g/cc) or less and a wet etch rate of 0.20 Å/s or less as measured in dilute HF.

In one aspect, the composition comprises at least one cyclic carbosilane having the following Formulae I and II and at least one anchoring group selected from a halide atom, an amino group, and combinations thereof:

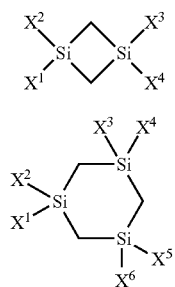

wherein $X^1$, $X^2$, $X^3$, $X^4$, $X^5$, and $X^6$ are each independently chosen from a hydrogen atom; a halide atom selected from F, Cl, Br, and I; an amino group having the formula $NR^1R^2$ wherein $R^1$ and $R^2$ are independently selected from the group consisting of a hydrogen atom, a $C_{1-10}$ linear alkyl group; a $C_{3-10}$ branched alkyl group; a $C_{3-10}$ cyclic alkyl group; a $C_{3-10}$ alkenyl group; a $C_{4-10}$ aryl group; and a $C_{4-10}$ heterocyclic group. In some embodiments of Formula I, II, or both I and II, any one or more of substituents $X^1$, $X^2$, $X^3$, $X^4$, $X^5$, and $X^6$ is linked to form a substituted or unsubstituted, saturated or unsaturated, cyclic group. In one particular embodiment of Formula I, II, or both I and II, any one or more of substituents $X^1$, $X^2$, $X^3$, $X^4$, $X^5$, and $X^6$ is either halide or amino group described above. In certain embodiments of Formula II, $X^1$, $X^2$, $X^3$, $X^4$, $X^5$, and $X^6$ are not all amino groups; In certain embodiments of Formula I or II, wherein $R^1$ and $R^2$ in the amino group having the formula $NR^1R^2$ are linked together to form a ring. In one particular embodiment, $R^1$ and $R^2$ are selected from a linear or a branched $C_3$ to $C_6$ alkyl group and are linked to form a cyclic ring. In alternative embodiments of Formula I or II, $R^1$ and $R^2$ are not linked together to form a ring. In other embodiments, $R^1$ and $R^2$ are different.

As previously mentioned, the cyclic carbosilane precursors having Formulae I and II described herein comprise at least one anchoring group. The term "anchoring group" denotes a labile group which can react with hydroxyl or other reactive sites such as, without limitation, NH or $NH_2$ on the surface of the substrate. Exemplary anchoring groups include, but not limited to, a halide atom (e.g., Cl, Br, and I) and an amino group. The term "amino group" denotes an organoamino group having from 1 to 10 carbon atoms derived from an organoamines with formula of $HNR^1R^2$ wherein $R^1$ and $R^2$ are as aforementioned. Exemplary amino groups include, but are not limited to, secondary amino groups derived from secondary amines such as dimethylamino ($Me_2N$—), diethyamino ($Et_2N$—), and di-iso-propylamino ($^iPr_2N$—); or primary amino groups derived from primary amines such as methylamino (MeNH—), ethylamine (EtNH—), iso-propylamino ($^iPrNH$—), sec-butylamino ($^sBuNH$—), and tert-butylamino ($^tBuNH$—).

In the formulas above and throughout the description, the term "alkyl" denotes a linear or branched functional group having from 1 to 10 or 2 to 4 carbon atoms. Exemplary linear alkyl groups include, but are not limited to, methyl, ethyl, n-propyl, n-butyl, n-pentyl, and hexyl. Exemplary branched alkyl groups include, but are not limited to, iso-propyl, iso-butyl, sec-butyl, tert-butyl, iso-pentyl, tert-pentyl, and iso-hexyl. In certain embodiments, the alkyl group may have one or more functional groups such as, but not limited to, an alkoxy group, a dialkylamino group, or combinations thereof, attached thereto. In other embodiments, the alkyl group does not have one or more functional groups attached thereto.

In the formulas above and throughout the description, the term "cyclic alkyl" denotes a cyclic functional group having from 3 to 10 or from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "alkenyl group" denotes a group which has one or more carbon-carbon double bonds and has from 2 to 10 or from 2 to 6 carbon atoms. Exemplary alkenyl groups include, but are not limited to, vinyl or allyl groups In the formulas above and throughout the description, the term "alkynyl group" denotes a group which has one or more carbon-carbon triple bonds and has from 2 to 10 or from 2 to 6 carbon atoms.

In the formulas above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl, pyridazinyl, pyrimidinyl, pyrazinyl, and imidazolyl.

In certain embodiments, the cyclic carbosilane precursor having either Formulae I or II described herein comprise at least one halide atom as its anchoring group and no amino groups. Referring to Formula I or II, these compounds have a halide atom selected from F, Cl, Br, and I as at least one of their substituents $X^1$, $X^2$, $X^3$, $X^4$, $X^5$, $X^6$ as the anchoring group, and none of the substituents $X^1$, $X^2$, $X^3$, $X^4$, $X^5$, $X^6$ are amino groups. These precursors are referred to herein as cyclic halocarbosilane compounds. Examples of certain halocarbosilane compounds are provided, for example, in the following Table I:

TABLE I

Cyclic Carbosilanes having at least one halide
group as the anchoring group (Cyclic Halocarbosilane)

| | | |
|---|---|---|
| 1-chloro-1,3-disilacyclobutane | 1-bromo-1,3-disilacyclobutane | 1-iodo-1,3-disilacyclobutane |
| 1,3-dichloro-1,3-disilacyclobutane | 1,3-dibromo-1,3-disilacyclobutane | 1,3-diiodo-1,3-disilacyclobutane |
| 1,1-dichloro-1,3-disilacyclobutane | 1,1-dibromo-1,3-disilacyclobutane | 1,1-diiodo-1,3-disilacyclobutane |

TABLE I-continued

Cyclic Carbosilanes having at least one halide group as the anchoring group (Cyclic Halocarbosilane)

 1,1,3-trichloro-1,3-disilacyclobutane

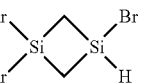 1,1,3-tribromo-1,3-disilacyclobutane

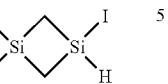 1,1,3-triiodo-1,3-disilacyclobutane

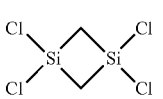 1,1,3,3-tetrachloro-1,3-disilacyclobutane

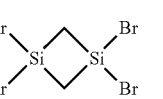 1,1,3,3-tetrabromo-1,3-disilacyclobutane

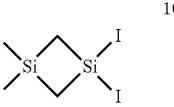 1,1,3,3-tetraiodo-1,3-disilacyclobutane

 1,3-dichloro-1,3-dimethyl-1,3-disilacyclobutane

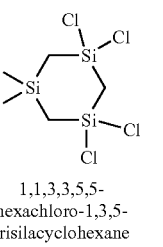 1,1,3,3,5,5-hexachloro-1,3,5-trisilacyclohexane

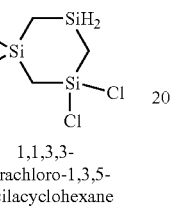 1,1,3,3-tetrachloro-1,3,5-trisilacyclohexane

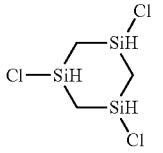 1,3,5-trichloro-1,3,5-trisilacyclohexane

F, Cl, Br, and I and at least an amino group as at least one of their substituents $X^1$, $X^2$, $X^3$, $X^4$, $X^5$, $X^6$ as the anchoring group. These precursors are referred to herein as cyclic haloaminocarbosilane compounds. Examples of certain halocarbosilane compounds are provided, for example, in the following Table II:

TABLE II

Cyclic Carbosilanes having at least one halide and at least one amino group as the anchoring group (Cyclic Haloaminocarbosilane)

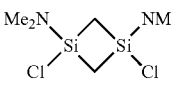 1,3-bis(dimethylamino)-1,3-dichloro-1,3-disilacyclobutane

 1,3-bis(diethylamino)-1,3-dichloro-1,3-disilacyclobutane

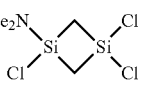 1-(dimethylamino)-1,3,3-trichloro-1,3-disilacyclobutane

In certain embodiments, the cyclic carbosilane precursor having either Formulae I or II described herein comprise at least one amino group as its anchoring group and no halide atoms. Referring to Formula I or II, these compounds have an amino group as at least one of their substituents $X^1$, $X^2$, $X^3$, $X^4$, $X^5$, $X^6$ as the anchoring group, and none of the substituents $X^1$, $X^2$, $X^3$, $X^4$, $X^5$, $X^6$ are halide atoms. These precursors are referred to herein as cyclic aminocarbosilane compounds. Examples of certain aminocarbosilane compounds are provided, for example, in the following Table III:

TABLE III

Cyclic Carbosilanes having at least one amino group as the anchoring group (Cyclic Aminocarbosilane)

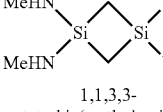 1,1,3,3-tetrakis(methylamino)-1,3-disilacyclobutane

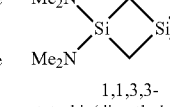 1,1,3,3-tetrakis(dimethylamino)-1,3-disilacyclobutane

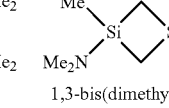 1,3-bis(dimethylamino)-1,3-dimethyl-1,3-disilacyclobutane

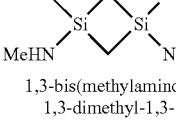 1,3-bis(methylamino)-1,3-dimethyl-1,3-disilacyclobutane

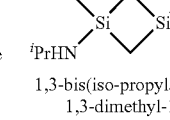 1,3-bis(iso-propylamino)-1,3-dimethyl-1,3-disilacyclobutane

In certain embodiments, the cyclic carbosilane precursor having either Formulae I or II described herein comprise at least one halide atom and at least amino group as its anchoring group and no amino groups. Referring to Formula I or II, these compounds have a halide atom selected from As previously mentioned, the silicon-containing film is deposited upon at least a surface of a substrate such as a semiconductor substrate. In the method described herein, the substrate may be comprised of and/or coated with a variety of materials well known in the art including films of silicon, silicon oxide, silicon nitride, amorphous carbon, silicon oxycarbide, silicon oxynitride, silicon carbide, germanium, germanium doped silicon, metal such as copper, tungsten, aluminum, cobalt, nickel, tantalum), metal nitride such as titanium nitride, tantalum nitride, metal oxide, group III/V metals or metalloids such as GaAs, InP, GaP and GaN, and a combination thereof. These coatings may completely coat the semi-conductor substrate, may be in multiple layers of various materials and may be partially etched to expose underlying layers of material. The surface may also deposited on it a photoresist material that has been exposed with a pattern and developed to partially coat the substrate. In certain embodiments, the semiconductor substrate comprises at least one surface feature selected from the group consisting of pores, vias, trenches, and combinations thereof.

The deposition method used to form the silicon-containing films or coatings are deposition processes. Examples of suitable deposition processes for the method disclosed herein include, but are not limited to, a chemical vapor deposition or an atomic layer deposition process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator.

In one embodiment, the silicon-containing film is deposited using an ALD process. In another embodiment, the silicon-containing film is deposited using a CCVD process. In a further embodiment, the silicon-containing film is deposited using a thermal ALD process. The term "reactor" as used herein, includes without limitation, reaction chamber or deposition chamber.

In certain embodiments, the method disclosed herein avoids pre-reaction of precursor(s) by using ALD or CCVD methods that separate the precursor(s) prior to and/or during the introduction to the reactor. In this connection, deposition techniques such as ALD or CCVD processes are used to deposit the silicon-containing film. In one embodiment, the film is deposited via an ALD process in a typical single wafer ALD reactor, semi-batch ALD reactor, or batch furnace ALD reactor by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases. In another embodiment, each reactant including the cyclic carbosilanes and reactive gas is exposed to a substrate by moving or rotating the substrate to different sections of the reactor and each section is separated by inert gas curtain, i.e. spatial ALD reactor or roll to roll ALD reactor.

Depending upon the deposition method, in certain embodiments, the cyclic carbosilane precursors described herein, and optionally other silicon-containing precursors, may be introduced into the reactor at a predetermined molar volume, or from about 0.1 to about 1000 micromoles. In this or other embodiments, the precursor may be introduced into the reactor for a predetermined time period. In certain embodiments, the time period ranges from about 0.001 to about 500 seconds.

In certain embodiments, the silicon-containing films deposited using the methods described herein are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, water ($H_2O$) (e.g., deionized water, purified water, distilled water, water vapor, water vapor plasma, oxygenated water, a composition comprising water and other organic liquid), oxygen ($O_2$), oxygen plasma, ozone ($O_3$), nitric oxide (NO), nitrogen dioxide ($NO_2$), carbon monoxide (CO), a plasma comprising water, a plasma comprising water and argon, hydrogen peroxide, a composition comprising hydrogen, a composition comprising hydrogen and oxygen, carbon dioxide ($CO_2$), air, and combinations thereof. In certain embodiments, the oxygen source comprises an oxygen source gas that is introduced into the reactor at a flow rate ranging from about 1 to about 2000 square cubic centimeters (sccm) or from about 1 to about 1000 sccm. The oxygen source can be introduced for a time that ranges from about 0.1 to about 100 seconds.

In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds.

In certain embodiments, the oxygen source is continuously flowing into the reactor while precursor pulse and plasma are introduced in sequence. The precursor pulse can have a pulse duration greater than 0.01 seconds while the plasma duration can range between 0.01 seconds to 100 seconds.

In certain embodiments, the silicon-containing films comprise silicon and nitrogen and optionally oxygen. In these embodiments, the silicon-containing films deposited using the methods described herein are formed in the presence of nitrogen-containing source. A nitrogen-containing source may be introduced into the reactor in the form of at least one nitrogen source and/or may be present incidentally in the other precursors used in the deposition process.

Suitable nitrogen-containing or nitrogen source gases may include, for example, ammonia, hydrazine, monoalkylhydrazine, symmetrical or unsymmetrical dialkylhydrazine, nitrogen, NO, $N_2O$, $NO_2$, a composition comprising nitrogen and hydrogen, ammonia plasma, nitrogen plasma, a plasma comprising ammonia and nitrogen, a plasma comprising nitrogen and hydrogen, an organoamine plasma, an organodiamine plasma and combination thereof. In embodiments wherein an organoamine plasma or organodiamine plasma is used as a nitrogen-containing source, exemplary organoamine plasmas include, are not limited to, diethylamine plasma, dimethylamine plasma, trimethyl plasma, trimethylamine plasma, an alkoxyamine plasma, methylamine, ethylamine, ethylenediamine, ethanolamine, piperazine, N,N'-dimethylethylenediamine, imidazolidine, cyclotrimethylenetriamine, and combination thereof.

In certain embodiments, the nitrogen source is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process using both a nitrogen and oxygen source, the precursor pulse can have a pulse duration that is greater than 0.01 seconds, and the nitrogen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In certain embodiments, the one or more method steps are conducted in the presence of a catalyst. In this or other embodiments, the catalyst is selected from a Lewis base such as pyridine, piperazine, ammonia, or other organic amines.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and combinations thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting film.

Energy is applied to the at least one of the precursor, nitrogen-containing source, reducing agent, other precursors or combination thereof to induce reaction and to form the film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof.

In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The cyclic carbosilane precursors and/or other silicon-containing precursors may be delivered to the reaction chamber, such as a CVD or ALD reactor, in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In this or other embodiments, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting silicon-containing film.

In a still further embodiment of the method described herein, the film or the as-deposited film is subjected to a treatment step. The treatment step can be conducted during at least a portion of the deposition step, after the deposition step, and combinations thereof. Exemplary treatment steps include, without limitation, treatment via thermal annealing; plasma treatment; ultraviolet (UV) light treatment; laser; electron beam treatment and combinations thereof to affect one or more properties of the film. The films deposited with the cyclic carbosilane precursors described herein, when compared to films deposited with previously disclosed carbosilane precursors under the same conditions, have improved properties such as, without limitation, a wet etch rate that is lower than the wet etch rate of the film before the treatment step, a density that is higher than the density prior to the treatment step, or a reduction of one or more impurities within the film. In one particular embodiment, during the deposition process, as-deposited films are intermittently treated. These intermittent or mid-deposition treatments can be performed, for example, after each ALD cycle, after every a certain number of ALD cycles, such as, without limitation, two (2) ALD cycles, five (5) ALD cycles, or after every ten (10) or more ALD cycles.

In an embodiment wherein the film is treated with a thermal annealing step, the annealing temperature is at least 100° C. or greater than the deposition temperature. In this or other embodiments, the thermal annealing temperature ranges from about 400° C. to about 1000° C. In an alternative embodiment, the annealing temperature is the same as, or within plus or minus of 100° C., of the depositing temperature. In this or other embodiments, the thermal annealing treatment can be conducted in a vacuum (<760 Torr) or an inert environment.

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment wherein the film is treated with a plasma, the plasma source is selected from the group consisting of nitrogen plasma, plasma comprising nitrogen and helium, plasma comprising nitrogen and argon, ammonia plasma, plasma comprising ammonia and helium, plasma comprising ammonia and argon, helium plasma, argon plasma, neon plasma, hydrogen plasma, plasma comprising hydrogen and helium, plasma comprising hydrogen and argon, an organic amine plasma, an organic diamine plasma, and combinations thereof. In one particular embodiment, the plasma comprises an inert gas selected from the group consisting of helium, neon, argon, krypton and combinations thereof.

In one particular embodiment, the method deposits a silicon-containing film selected from a carbon doped silicon oxide, carbon doped silicon nitride, and carbon doped silicon oxynitride film, comprising the following steps:

placing one or more substrates into a reactor;

heating the reactor to one or more temperatures ranging from about 25° C. to about 700° C. and optionally maintained at a pressure of 100 torr or less;

introducing at least one cyclic carbosilane selected from the group consisting of a cyclic halocarbosilane and a cyclic haloaminocarbosilane;

introducing a nitrogen source to react with the chemically absorbed precursors to form a carbon doped silicon nitride film; and exposing the carbon doped silicon nitride film to an oxygen source at one or more temperatures ranging from about ambient temperature (e.g., 25° C.) to 1000° C., or from about 100° to 400° C., to convert the carbon doped silicon nitride film into a carbon doped silicon oxide or carbon-doped silicon oxynitride film.

In a further embodiment of the method described herein, the silicon-containing film is deposited using a thermal ALD process. In this embodiment, the method comprises:

placing one or more substrates into a reactor;

heating the reactor to one or more temperatures ranging from ambient (e.g., 25° C.) to about 700° C. and optionally maintained at a pressure of 100 torr or less;

introducing at least one cyclic carbosilane selected from the group consisting of a cyclic halocarbosilane and a cyclic haloaminocarbosilane;

providing an oxygen source and optionally a catalyst into the reactor to react with the surface to form an as-deposited film wherein the catalyst comprises a Lewis base; and optionally annealing the as-deposited film at one or more temperatures higher than the heating temperature wherein the annealing step is conducted at one or more temperatures ranging from about 400° C. to about 1000° C.;

optionally post-deposition treating the as-deposited film with an oxygen source at one or more temperatures ranging from about ambient temperature to about 1000° C., or from about 100° to 400° C., to provide a film having a density; and optionally exposing the as-deposited film to a UV source; and optionally post-deposition treating the processed film to a noble gas or plasma comprising hydrogen.

In yet another further embodiment of the method described herein, the silicon containing is deposited using a thermal ALD process with a nitrogen source comprising an organic amine. In this embodiment, the method comprises:

placing one or more substrates comprising a surface feature into a reactor;

heating the reactor to one or more temperatures ranging from ambient temperature to about 700° C. and optionally maintaining the reactor at a pressure of 100 torr or less;

introducing into the reactor at least one cyclic carbosilane selected from the group consisting of a cyclic halocarbosilane, a cyclic haloaminocarbosilane, and a cyclic aminocarbosilane;

providing a nitrogen source into the reactor to react with the precursor to form a silicon carbonitride as-deposited film; and optionally post-deposition annealing the as-deposited film;

optionally post-deposition treating the carbon doped silicon nitride film with an oxygen source at one or more temperatures ranging from about ambient temperature to 1000° C., or from about 100° to 400° C. to convert the carbon doped silicon nitride film into a carbon doped silicon oxide film wherein the oxygen source is selected from the group consisting of water vapors, water plasma, oxygenated water, oxygenated water steam, oxygen, oxygen plasma, oxygen/helium plasma, oxygen/argon plasma, nitrogen oxides plasma, carbon dioxide plasma, hydrogen peroxide, organic peroxides, nitrous oxide, ozone, ozonated water, and combinations thereof; and optionally exposing the carbon doped silicon oxide film to a UV light source. In this or other embodiments, the UV exposure step can be carried out either during film deposition or once deposition has been completed.

In yet another embodiment of the method described herein, the carbon doped silicon oxide, silicon oxynitride, carbon doped silicon oxynitride film, carbon doped silicon nitride, or silicon carbide film is deposited using a plasma ALD process. In this embodiment, the method comprises:

placing one or more substrates comprising a surface feature selected from a pore, a via or a trench, or combination thereof into a reactor;

heating the reactor to one or more temperatures ranging from ambient temperature to about 700° C. and optionally maintaining the reactor at a pressure of 100 torr or less;

introducing into the reactor at least one cyclic carbosilane selected from the group consisting of a cyclic halocarbosilane, a cyclic haloaminocarbosilane, and a cyclic aminocarbosilane;

providing a plasma source into the reactor to react with the precursor to form a silicon carbonitride film wherein the plasma source is selected from the group consisting of nitrogen plasma, plasma comprising nitrogen and helium, plasma comprising nitrogen and argon, ammonia plasma, plasma comprising ammonia and helium, plasma comprising ammonia and argon, helium plasma, argon plasma, neon plasma, hydrogen plasma, plasma comprising hydrogen and helium, plasma comprising hydrogen and argon, an organic amine plasma, an organic diamine plasma, and combinations thereof; and optionally post-deposition thermal annealing the as-deposited films at one or more temperatures ranging from about 400° C. to 1000° C.;

optionally post-deposition treating the carbon doped silicon nitride film with an oxygen source at one or more temperatures ranging from about ambient temperature to about 1000° C. or from about 100° to about 400° C. to convert the carbon doped silicon nitride film into a carbon doped silicon oxide film wherein the oxygen source is at least one selected from the group consisting of water vapors, water plasma, oxygenated water, oxygenated water steam, oxygen, oxygen plasma, oxygen/helium plasma, oxygen/argon plasma, nitrogen oxides plasma, carbon dioxide plasma, hydrogen peroxide, organic peroxides, and combinations thereof; and optionally post-deposition exposing the processed film to an UV light source; and optionally post-deposition treating the processed film to noble gas or hydrogen containing plasma in order to improve at least one of the films' properties.

In yet another further embodiment of the method described herein, the carbon doped silicon oxide, silicon oxynitride, carbon doped silicon oxynitride film, carbon doped silicon nitride, or silicon carbide is deposited using a plasma ALD process. In this embodiment, the method comprises:

placing one or more substrates comprising a surface feature selected from a pore, a via or a trench, or combination thereof into a reactor;

heating the reactor to one or more temperatures ranging from 25° C. to about 650° C. and optionally maintaining the reactor at a pressure of 10 torr or less;

introducing into the reactor at least one cyclic carbosilane selected from the group consisting of a cyclic halocarbosilane, a cyclic haloaminocarbosilane, and a cyclic aminocarbosilane;

providing a plasma source into the reactor to react with the sample surface to form a silicon carbonitride film wherein the plasma source is selected from the group consisting of a nitrogen plasma, a plasma comprising nitrogen and helium, a plasma comprising nitrogen and argon, ammonia plasma, a plasma comprising ammonia and helium, a plasma comprising ammonia and argon, helium plasma, argon plasma, neon plasma, hydrogen plasma, a plasm comprising hydrogen and helium, a plasm comprising hydrogen and argon, organic amine plasma, an organic diamine, and combinations thereof; and optionally post-deposition thermal annealing the as-deposited films;

optionally post-deposition treating the carbon doped silicon nitride film with an oxygen source at one or more temperatures ranging from about ambient temperature (e.g., 25° C.) to about 1000° C. wherein the oxygen source is selected from the group consisting of water vapor, water plasma, oxygenated water, oxygenated water steam, oxygen, oxygen plasma, oxygen/helium plasma, oxygen/argon plasma, nitrogen oxides plasma, carbon dioxide plasma, hydrogen peroxide, organic peroxides, and combinations thereof;

optionally post-deposition exposing the processed film to UV light; and optionally post-deposition treating the processed film to a plasma selected from a noble gas and a hydrogen-containing plasma.

In yet another further embodiment of the method described herein, the carbon doped silicon oxide, silicon oxynitride, carbon doped silicon oxynitride, or carbon doped silicon nitride film is deposited using a thermal ALD process and inert plasma to improve film properties. In this embodiment, the method comprises:

placing one or more substrates comprising a surface feature into a reactor;

heating to reactor to one or more temperatures ranging from 25° C. to about 700° C. and optionally maintaining the reactor at a pressure of 100 torr or less;

introducing into the reactor at least one cyclic carbosilane selected from the group consisting of a cyclic halocarbosilane, a cyclic haloaminocarbosilane, and a cyclic aminocarbosilane;

providing a nitrogen source into the reactor to react with the surface to form a silicon carbonitride films; and providing a plasma selected from an inert plasma and a hydrogen plasma wherein the inert plasma comprises at least one selected from helium, neon, argon, krypton and combinations thereof;

optionally post-deposition annealing the films;

optionally post-deposition treating the carbon doped silicon nitride film with an oxygen source at one or more temperatures ranging from about ambient temperature to 1000° C. or from about 100° to 400° C. to convert the carbon doped silicon nitride film into a carbon doped silicon oxide film; and optionally post-deposition exposing the processed film to an UV light source; and optionally post-deposition treating the processed film to noble gas or hydrogen containing plasma in order to improve at least one of the films' properties.

In yet another further embodiment of the method described herein, the carbon doped silicon oxide, silicon oxynitride, carbon doped silicon oxynitride, or carbon doped silicon nitride film is deposited using a thermal ALD process. In this embodiment, the method comprises:

placing one or more substrates comprising a surface feature;

heating to reactor to one or more temperatures ranging from 25° C. to about 700° C. and optionally maintaining the reactor at a pressure of 100 torr or less;

introducing into the reactor at least one cyclic carbosilane selected from the group consisting of a cyclic halocarbosilane, a cyclic haloaminocarbosilane, and a cyclic aminocarbosilane;

providing a nitrogen source into the reactor to react with the surface to form a silicon carbonitride films; and providing oxygen source to convert silicon carbonitride to carbon doped siliconoxynitride wherein the oxygen source comprises at least one selected from the group consisting of water vapor, oxygen, nitrous oxide, ethylene glycol, ozone, oxygen plasma, nitrous oxide plasma, carbon dioxide (CO2), carbon monoxide (CO), $CO_2$ plasma, CO plasma, $O_2$ plasma and combinations thereof;

optionally post-deposition annealing the as-deposited films in vacuum (<760 Torr) or inert environment at one or more temperatures ranging from about 400° C. to about 1000° C.;

optionally post-deposition treating the carbon doped silicon nitride film with an oxygen source at one or more temperatures ranging from about 25° C. to 1000° C. or from about 100° to 400° C. to convert the carbon doped silicon nitride film into a carbon doped silicon oxide film; and optionally post-deposition exposing the processed film an UV light source; and optionally post-deposition treating the processed film to noble gas or hydrogen containing plasma in order to improve at least one of the films' properties.

EXAMPLES

General Film Deposition Example

Unless otherwise specified, film depositions were performed in a lab scale atomic layer deposition (ALD) reactor using a cyclic carbosilane precursor and the nitrogen source ammonia. The ALD cycle steps and process conditions are provided in the following Table IV:

TABLE IV

| ALD Cycle Steps and Process Conditions | | | |
|---|---|---|---|
| Steps | Descriptions | Time | Notes |
| 1 | Insert Si substrates into a reactor | | |
| 2 | Heat substrates to desired temperature | ~1-2 hours | T = 300-500° C. |

TABLE IV-continued

ALD Cycle Steps and Process Conditions

| Steps | Descriptions | Time | Notes |
|---|---|---|---|
| 3 | Close throttle valve | 2 seconds (s) | Throttle valve is closed to increase residence time |
| 4 | Deliver cyclic carbosilane dose | 2 s | Vapor draw; vapor pressure is 14-18 Torr |
| 5 | Deliver cyclic carbosilane dose | 2 s | |
| 6 | Deliver cyclic carbosilane dose | 2 s | After 3 doses of Si precursor, chamber pressure is ~150-250 mTorr |
| 7 | Open throttle valve | 2 s | |
| 8 | Flow $N_2$ to purge the reactor | 6 s | $N_2$ flow is 5 lpm |
| 9 | Evacuate the reactor to base pressure | 6 s | Base pressure is <1 mTorr |
| 10 | Flow $NH_3$ | 24 s | Pressure is set to 5 Torr; $NH_3$ flow is 100 sccm |
| 9 | Flow $N_2$ to purge the reactor | 6 s | $N_2$ flow is 5 liters per minute (lpm) |
| 10 | Evacuate the reactor to base pressure | 6 s | Base pressure is <1 mTorr |
| 11 | Remove Si sample from the reactor | | |

During the deposition, process steps 3 to 10 are repeated for a number of cycles of up to 2000 times to get a desired thickness of the as-deposited carbon doped silicon nitride films. The resulting as-deposited films were subjected to either an in situ (annealing performed inside the reactor on the as-deposited film) or ex situ annealing (annealing outside or in a separate chamber) to convert into the films into a carbon doped silicon oxide films. Typical annealing conditions performed were as follows: moisture annealing was performed under vacuum at 200 mTorr; oxygen annealing was performed at 2 Torr; or air annealing was performed on a hot plate at ambient temperature (e.g., 25° C.) or about 300° C.

Refractive index and thickness were measured directly after deposition using an ellipsometer at 632.8 nm. Bulk film composition was characterized using X-Ray Photoelectron Spectroscopy (XPS) at few nanometer (2-5 nm) down from the surface in order to eliminate the effect of adventitious carbon. Film density was characterized using X-Ray Reflectometry (XRR).

Wet etch rate process was performed under dilute HF (dHF, 1:99 49% HF and DI water). During the process, a thermal oxide film was etched at the same time used to ensure etch solution consistency. Typical thermal oxide WER is 0.55 Å/s.

Example 1: Synthesis of
1-chloro-1,3-disilacyclobutane

In a nitrogen-filled glovebox, 1,3-disilacyclobutane (15.0 g, 0.170 mol) was quickly added to a stirred mixture of copper(I) chloride (5.61 g, 0.0567 mol) in $Et_2O$ (50 mL). The reaction was stirred for 30 minutes, during which time the solids turned dark grey/brown and a gaseous by-product (presumably $H_2$) evolved. The reaction mixture was filtered to remove the solids and the solvent and unreacted starting materials were removed by distillation at a pressure of 1 atmospheres (atm). This procedure was performed a total of five times, and the combined crude products were purified by vacuum distillation to yield 20.4 grams (g) of 1-choro-1,3-disilacyclobutane in solution. The 1-choro-1,3-disilacyclobutane within the solution was identified by gas chromatography (GC-TCD), mass spectrometry (GC-MS), and $^1H$ NMR spectroscopy. Gas chromatographic analyses were carried out on the product effluent using a TCD equipped HP-5890 Series II GC and a 0.53 mm diameter×30 m Supleco column containing 3 μm thick SPB-5 media. GC-MS showed the following peaks: 122 (M+), 107 (M-15), 93, 85, 81, 58, and 43.

Example 2: Synthesis of
1,3-dichloro-1,3-disilacyclobutane

In a nitrogen-filled glovebox, copper(II) chloride (89.6 g, 0.666 mol) and copper(I) iodide (1.51 g, 0.00793 mol) were mixed together and added slowly to a stirred solution of 1,3-disilacyclobutane (14.0 g, 0.159 mol) in $Et_2O$ (300 mL) over 2 hours at room temperature. The reaction mixture was allowed to vent excess pressure via a needle-pierced septum. After 6 hours, the vent needle was removed and the grey reaction mixture was allowed to stir overnight. The solids were removed by filtration, and the filtrate was concentrated under reduced pressure (down to 80 Torr). A 20.4 gram amount of a light yellow crude product was obtained, and determined by GC-MS to contain a mixture of both isomers (cis and trans) of 1,3-dichloro-1,3-disilacyclobutane as the major component. GC-MS showed the following peaks: 156 (M-1), 141, 119, 105, 93, 78, 63, 58, and 43.

Example 3: Synthesis of
1-bromo-1,3-disilacyclobutane and
1,3-dibromo-1,3-disilacyclobutane In a nitrogen filled glovebox, 1,3-disilacyclobutane (1.0 g, 0.011 mol) was added to a stirred mixture of copper(I) bromide (1.6 g, 0.011 mol) in diethyl ether (5 g) in a scintillation vial, and the reaction was stirred overnight. The gaseous byproduct (presumably $H_2$) was allowed to vent and the solution was determined by GC-MS to contain a mixture of 1-bromo-1,3-disilacyclobutane (m/z=166 (M+), 151 (M-15), 137, 123, 109, 85, 69, 59, 43) and 1,3-dibromo-1,3-disilacyclobutane (m/z=246 (M+) 231 (M-15), 216, 202, 189, 159, 137, 109, 69, 58, 43.

Example 4: Synthesis of 1,1,3,3-tetrabromo-1,3-disilacyclobutane

Under the protection of nitrogen, acetyl bromide (209 g, 1.70 mol) was combined with 1,1,3,3-tetraethoxy-1,3-disilacyclobtuane (75 g, 0.28 mol) in the presence of $AlBr_3$ (1.9 g, 0.0071 mol) and was stirred for approximately 1 month at room temperature. The unreacted acetyl bromide and ethyl acetate byproduct were removed under reduced pressure. The remaining wet solids were stirred in pentane (30 mL), then collected by vacuum filtration. The crude solids were purified via flask-to-flask vacuum sublimation (90° C. at 150 mTorr) to yield 59 g of colorless crystalline solids, determined by GC-MS to be 1,1,3,3-tetrabromo-1,3-disilacyclobutane. GC-MS showed the following peaks: 404 (M+), 376, 323, 297, 267, 243, 229, 202, 188, 165, 149, 135, 109, 81, 55, 42. Melting point (m.p.)=117° C.; Boiling point (b.p)=252° C. Single crystals were analyzed by X-ray diffraction to confirm its structure.

Example 5: Synthesis of 1,3-bis(diethylamino)-1,3-dichloro-1,3-disilacyclobutane Under the protection of nitrogen, a solution of diethylamine (29.5 g, 0.403 mol) in hexanes (80 mL) was added dropwise via addition funnel to a stirred solution of 1,1,3,3-tetrachloro-1,3-disilacyclobutane (40.0 g, 0.177 mol) and triethylamine (44.4 g, 0.439 mol) in hexanes (400 mL) at −20° C. The resulting white slurry was allowed to warm to room temperature and was stirred overnight. The white solids were removed via filtration and rinsed twice with hexanes (30 mL). The combined filtrates were concentrated under reduced pressure at room temperature until the volume remained unchanged. The crude product was heated to 100° C. and vacuum-transferred into a cold trap at −78° C. to yield 28.6 g of a colorless liquid determined by GC-MS to be a mixture of isomers (cis and trans) of 1,3-bis(diethylamino)-1,3-dichloro-1,3-disilacyclobutane. GC-MS showed the following peaks: 298 (M-1), 283, 269, 255, 239, 226, 212, 198, 184, 170, 157, 143, 134, 121, 106, 93, 72, 58, 42. B.p.=283° C.

Example 6: Synthesis of 1,3-bis(dimethylamino)-1,3-dichloro-1,3-disilacyclobutane Under the protection of nitrogen, a solution of dimethylamine (2.11 M, 500 mL, 1.06 mol) in THF was added dropwise to a stirred solution of 1,1,3,3-tetrachloro-1,3-disilacyclobutane (120.8 g, 0.535 mol) and $Et_3N$ (119 g, 1.18 mol) in hexanes (1.5 L) at −20° C. The resulting white slurry was allowed to warm to room temperature and was stirred overnight. The white solids were removed via filtration and rinsed twice with hexanes (100 mL). The solvent was removed under reduced pressure at room temperature until the volume remained unchanged. The crude product was purified by flask-to-flask vacuum distillation (80° C. at 150 mTorr) and was collected in a cold trap (−15° C.) to yield 77 g of a colorless crystalline solid determined by GC-MS to be a mixture of isomers (cis and trans) of 1,3-bis(dimethylamino)-1,3-dichloro-1,3-disilacyclobutane. GC-MS showed the following peaks: 243 (M+), 228 (M-15), 208, 199, 185, 171, 157, 143, 121, 106, 93, 72, 63, 43. M.p=6-41° C.; b.p=230° C. Single crystals of the trans isomer were grown from a concentrated solution of in pentane at −35° C. and were analyzed by X-ray diffraction to confirm its structure.

Example 7: Synthesis of 1,3-dichloro-1,3-dimethyl-1,3-disilacyclobutane

Under the protection of nitrogen, acetyl chloride (115 g, 1.46 mol) was added dropwise via addition funnel into a stirred mixture of 1,3-diethoxy-1,3-dimethyl-1,3-disilacyclobutane (120 g, 0.587 mol) and iron(III) chloride (0.47 g, 0.0029 mol) at room temperature. The reaction was stirred for 14 days. The volatiles were vacuum transferred away from the iron catalyst and then purified by vacuum distillation (12 Torr/70° C.) to yield 98 g of a colorless liquid determined by GC-MS to by a mixture of isomers (cis and trans) of 1,3-dichloro-1,3-dimethyl-1,3-disilacyclobutane. GC-MS showed the following peaks: 184 (M-1), 169, 149, 133, 93, 79, 71, 63.

Example 8: Deposition of Silicon-Containing Film Via Thermal ALD Deposition Using the Cyclic Carbosilane Precursor 1,1,3,3-Tetrachloro-1,3-disilacyclobutane Silicon-containing films were deposited from 1,1,3,3-tetrachloro-1,3-disilacyclobutane as the cyclic carbosilane precursor and ammonia at substrate temperature of 300° C. and 500° C. using the process steps described herein in Table IV with no post deposition treatment. After initial refractive index and thickness measurements were obtained, the samples were stored at room temperature and measured intermittently. Refractive index and thickness for the deposited film is summarized in Table V. Table VI shows that the refractive index of the film deposited at 300° C. decreased over time, from 1.65 to 1.53 after 24 hours, indicating an oxidation process by ambient at room temperature. No further refractive index drop was observed after 24 hours. Other film properties such as XPS and wet etch rate in dilute HF were obtained approximately a week after film deposition. The results of these tests are provided in Table VII.

TABLE V

Refractive index and thickness of thermal ALD carbon doped silicon oxide films

| Temperature (° C.) | Growth per cycle (Å/cycle) | Refractive index |
|---|---|---|
| 300 | 0.2 | 1.65 |
| 500 | 0.3 | 1.57 |

TABLE VI

Refractive index changes of film deposited at 300° C.
after stored in ambient at room temperature

| Time (hours) | Refractive index |
|---|---|
| As-deposited | 1.64 |
| 24 | 1.53 |
| 48 | 1.53 |

TABLE VII

Film composition and WER of ALD films

| Temperature (° C.) | % O | % N | % C | % Cl | % Si | dHF WER (Å/s) |
|---|---|---|---|---|---|---|
| 300 | 41.5 | 1.3 | 14.8 | ND | 42.4 | 0.03 |
| 500 | 20.1 | 18.1 | 23.9 | 0.4 | 37.6 | 0.06 |
| Thermal oxide | N/A | N/A | N/A | N/A | N/A | 0.49 |

Referring to Table VII, the XPS data shows that the carbon doped silicon oxide films deposited from the cyclic carbosilane and ammonia had little chlorine content (e.g., less than 0.5 at. %). There is a small amount of nitrogen detected in film deposited at 300° C. whereas the film deposited at 500° C. had a significantly higher nitrogen content. It is believed that at the lower deposition temperature of 300° C., the process may provide more Si—$NH_2$ or Si—NH—Si fragments that are susceptible to oxidation. Deposition at the higher 500° C. temperature, on the other hand, may provide enough energy to form a Si—$N_x$ network which is more resistant to oxidation.

Example 9. Carbon Doped Silicon-Containing Films ALD Deposition Using 1,1,3,3-tetrachloro-1,3-disilacyclobutane Followed by Ex-Situ Annealing in Various Environments Si containing films were deposited from 1,1,3,3-tetrachloro-1,3-disilacyclobutane as the cyclic carbosilane precursor and ammonia at 300° C. using the process steps described in Table IV.

After deposition, refractive index and thickness were measured and the samples from each deposition were separated into three (3) sections. Each section was thermally annealed under either ambient (air), oxygen ($O_2$), or water ($H_2O$) vapor, at 300° C. as previously described above. The refractive index and thickness were measured after 1 hour annealing and before subsequently subjected to an additional annealing treatment for another 2 hours. The results are provided in the following Table VIII.

TABLE VIII

Refractive index changes with annealing at 300° C.
at different annealing environment

| | Refractive Index | | |
|---|---|---|---|
| Annealing environment (300° C.) | As-deposited | 1 hour anneal | 1 + 2 hours anneal |
| Oxygen | 1.65 | 1.58 | 1.57 |
| Water vapor | 1.65 | 1.55 | 1.54 |
| Air | 1.65 | 1.51 | 1.52 |

The film deposition growth rate was 0.2 Å/cycle. Table VIII shows refractive index changes upon annealing under different conditions. The drop in refractive index after annealing indicates that the film converted to a silicon oxycarbide (SiO:C) film. The process is close to completion after the 1 hour annealing, as indicated by minimal refractive changes upon further annealing.

The wet etch rate in 1:99 HF films after post deposition annealing was not detected (<0.01 Å/s) while thermal oxide film shows an etch rate of 0.55 Å/s. The film was subjected to dilute HF with a higher concentration of HF in the solution (10:90 49% HF:DI water). After being subjected to a higher HF acid concentration, no film etching was detected (<0.01 Å/s) while the comparative thermal oxide film shows an etch rate of 5.5 Å/s.

Example 10. Film Composition of Carbon Doped Silicon-Containing Films Via Thermal ALD Deposition Silicon-containing films were deposited from 1,1,3,3-tetrachloro-1,3-disilacyclobutane as the cyclic carbosilane precursor and ammonia at 300° C. using the process steps described in Table IV. After deposition, the refractive index and thickness were measured and the films were then separated into three (3) sections. Each section was ex-situ thermally annealed either under $O_2$, water vapor or air, as previously described above, at 300° C. for a continuous 3 hours each. The film refractive index, of the as-deposited film after it was taken out from reactor, was 1.64. The refractive index dropped to 1.55-1.57 after ex-situ post deposition treatment, consistent with results in Table VIII. Film composition and density of deposited films are summarized in Table IX.

TABLE IX

Film composition and density of annealed ALD films

| Annealing environment (300° C.) | % O | % N | % C | % Cl | % Si | Density (g/cc) |
|---|---|---|---|---|---|---|
| Oxygen | 39.6 | 2.8 | 24.7 | ND | 32.5 | 1.59 |
| Water vapor | 36.4 | 3.6 | 25.1 | 0.3 | 34.6 | 1.59 |
| Air | 34.7 | 4.9 | 27.0 | 0.4 | 41.1 | 1.59 |

Example 11. Carbon Doped Silicon-Containing Films Via Thermal ALD Deposition Using Ammonia and Water Process Si containing films were deposited from the cyclic haloaminocarbonsilane precursor 1,3-dichloro-1,3-(dimethyl)amino-1,3-disilacyclobutane using the process steps described in Table X. In each ALD cycle, the $SiCNH_x$ surface was converted to SiCOH, therefore eliminating the need for a post deposition treatment.

TABLE X

ALD cycle for depositing SiOC

| Steps | Descriptions | Time | Notes |
|---|---|---|---|
| 1 | Insert Si substrates into a reactor | | |
| 2 | Heat substrates to desired temperature | ~1-2 hours | T = 300-500° C. |
| 3 | Close throttle valve | 2 seconds (s) | Throttle valve is closed to increase residence time |
| 4 | Deliver cyclic carbosilane precursor dose | 2 s | Vapor draw; vapor pressure is between 14-18 Torr |
| 5 | Deliver cyclic carbosilane precursor dose | 2 s | |
| 6 | Deliver cyclic carbosilane precursor dose | 2 s | After 3 doses of Si precursor, chamber pressure is ~150-250 mTorr |
| 7 | Open throttle valve | 2 s | |
| 8 | Flow $N_2$ to purge the reactor | 6 s | $N_2$ flow is 5 lpm |
| 9 | Evacuate the reactor to base pressure | 6 s | Base pressure is <1 mTorr |
| 10 | Flow $NH_3$ | 24 s | Pressure is set to 5 Torr; $NH_3$ flow is 100 sccm |
| 9 | Flow $N_2$ to purge the reactor | 6 s | $N_2$ flow is 5 lpm |
| 10 | Evacuate the reactor to base pressure | 6 s | Base pressure is <1 mTorr |
| 11 | Flow $H_2O$ vapor | 10 s | Chamber pressure is 30 Torr |
| 12 | Flow $N_2$ to purge the reactor | 6 s | $N_2$ flow is 5 lpm |
| 13 | Evacuate the reactor to base pressure | 6 s | Base pressure is <1 mTorr |
| 14 | Remove sample from the reactor | | |

During deposition, process steps 3 to 13 were repeated multiple times to get a desired film thickness. The resulting film had a refractive index of 1.58 with a growth per cycle of 0.27 Å/cycle. The IR spectrum of the sample was obtained and is provided in FIG. 1. FIG. 1 shows that the deposited film is mostly SiO:C and has a composition of 24.3% C, 5.0% N, 41.0% O, 33.6% Si. The resultant film had a non-detectable wet etch rate in dilute HF or a WER of less than 0.01 Å/s.

Example 12. Carbon Doped Si Containing Films Thermal ALD Deposition and Post-Deposition Ex-Situ Annealing in Air Silicon-containing films were deposited from the cyclic haloaminocarbosilane 1,1,3,3-tetrachloro-1,3-disilacyclobutane precursor and ammonia at 300° C. using the process steps described in Table IV. The deposited film was subjected to the ex-situ post deposition repetitive annealing and characterization process described above. The annealing was performed at ambient atmosphere on a hot plate at 300° C. Refractive index and thickness change with different annealing times are reported in Table XI.

TABLE XI

Refractive index and thickness changes with annealing under air

| Annealing time (minutes) | Thickness (Å) | Refractive index |
|---|---|---|
| As deposited | 647 | 1.64 |
| 5 | 652 | 1.59 |
| 15 | 652 | 1.57 |
| 30 | 656 | 1.57 |
| 60 | 656 | 1.56 |
| 120 | 654 | 1.55 |

Referring to Table XI, the film refractive index dropped from 1.64 to 1.55 after being subjected to an annealing treatment under ambient, indicating conversion from silicon nitride films into silicon oxide films.

Example 13. Carbon Doped Si-Containing Films Via Thermal ALD Deposition and In-Situ Post-Treatment with Oxygen Source Silicon-containing films were deposited from the cyclic halocarbosilane 1,1,3,3-tetrachloro-1,3-disilacyclobutane precursor and ammonia at 300° C. using the process steps described in Table XII.

TABLE XII

ALD cycles and process parameters

| Steps | Descriptions | Time | Notes |
|---|---|---|---|
| 1 | Insert Si substrates into a reactor | | |
| 2 | Heat substrates to desired temperature | ~1-2 hours | T = 300-500° C. |

TABLE XII-continued

ALD cycles and process parameters

| Steps | Descriptions | Time | Notes |
|---|---|---|---|
| 3 | Close throttle valve | 2 seconds (s) | Throttle valve is closed to increase residence time |
| 4 | Deliver cyclic carbosilane precursor dose | 2 s | Vapor draw; vapor pressure is between 14-18 Torr |
| 5 | Deliver cyclic carbosilane precursor dose | 2 s | |
| 6 | Deliver cyclic carbosilane precursor dose | 2 s | After 3 doses of Si precursor, chamber pressure is ~150-250 mTorr |
| 7 | Open throttle valve | 2 s | |
| 8 | Flow $N_2$ to purge the reactor | 6 s | $N_2$ flow is 5 lpm |
| 9 | Evacuate the reactor to base pressure | 6 s | Base pressure is <1 mTorr |
| 10 | Flow $NH_3$ | 24 s | Pressure is set to 5 Torr; $NH_3$ flow is 100 sccm |
| 9 | Flow $N_2$ to purge the reactor | 6 s | $N_2$ flow is 5 lpm |
| 10 | Evacuate the reactor to base pressure | 6 s | Base pressure is <1 mTorr |
| 11 | Flow $H_2O$ vapor to the reactor | 3 hours | Chamber pressure is set to 30 Torr |
| 12 | Remove Si sample from the reactor | | |

Process steps 3 to 11 were repeated multiple times to get the desired film thickness. After the ALD cycles were completed, water vapor was introduced to the reactor while the film was in the chamber in-situ in order to deposit a silicon oxycarbide (SiOC) film. The resultant film had a composition of 39.0% O, 2.6% N, 25.1% C, 33.2% Si as measured by XPS and density of 1.55 g/cc as measured by XRR.

Example 14. Post-Deposition UV Treatment of Carbon Doped Silicon Containing Film Multiple silicon-containing films were deposited from the cyclic halocarbosilane precursor 1,1,3,3-tetrachlorodisilacyclobutane as described in Example 10. The films were deposited using ammonia as the nitrogen source followed by ex-situ thermal annealing in ambient atmosphere on a hot plate for 3 hours. Both deposition and annealing temperatures were 300° C. To remove trapped water and terminal hydroxyls from the films, the films were subjected to UV annealing. UV annealing was performed using a Fusion UV system with a broad band UV bulb, installed on the Applied Materials Precision-5000 system. The samples were held under a helium gas flow at one or more pressures below 10 Torr and at one or more temperatures below 400° C. Thickness and refractive index were measured on a Woollam Ellipsometer system before and after UV annealing. Dielectric constants were determined using Hg probe technique on mid-resistivity p-type wafers

TABLE XIII

Effect of UV treatment on film dielectric constant and shrinkage

| UV treatment (minutes) | Thickness shrinkage (%) | K |
|---|---|---|
| No UV treatment | 0 | 5.8 |
| 1 | 8 | 3.2 |
| 3 | 20 | 3.0 |
| 5 | 13 | 3.3 |
| 10 | 17 | 3.7 |

TABLE XIV

Film composition and density after UV treatment

| UV treatment time (minutes) | Density (g/cc) | C (%) | N (%) | O (%) | Si (%) | Cl (%) |
|---|---|---|---|---|---|---|
| 0 (No UV) | 1.59 | 24.7 | 4.9 | 27.0 | 32.5 | 0.4 |
| 1 | 1.62 | 20.2 | 4.1 | 42.2 | 33.5 | ND |
| 3 | N/A | 25.2 | ND | 41.4 | 33.4 | ND |
| 5 | 1.65 | 23.8 | 1.5 | 40.1 | 34.6 | ND |
| 10 | 1.77 | 21.0 | 3.2 | 41.5 | 34.4 | ND |

Table XIII shows the comparison of shrinkage and dielectric constant with UV exposure while Table XIV shows the correspondent density and composition. Samples exposed to 3 minutes of UV were damaged during handling, thus, no density measurements were taken as shown by (ND) in Table XIV. UV exposure to 1 minute or more shows significant lower dielectric constant and some film shrinkage which resulted in a higher film density while carbon content in the film did not seem to be affected.

Figure 2:
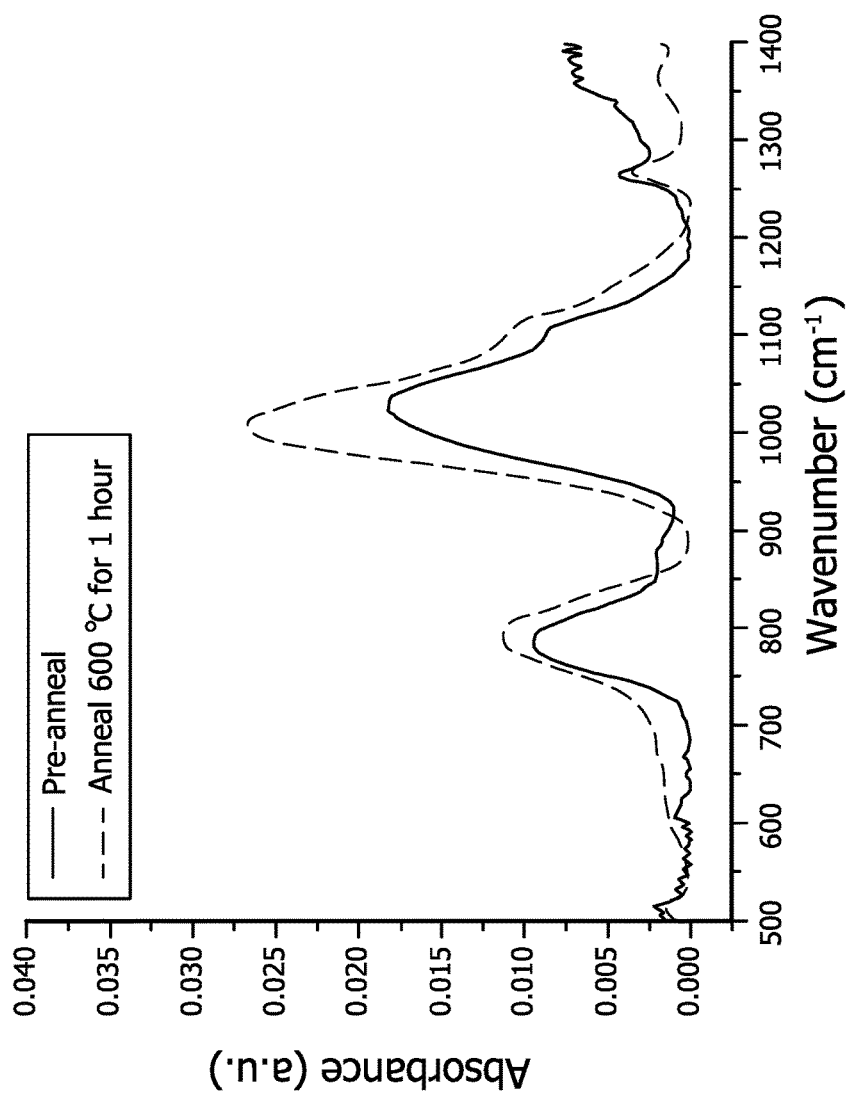
FIG. 2 provides a comparison of the FTIR spectra comparison before (solid line) and after vacuum anneal (dashed line), as described in Example 15.

Example 15. Post Deposition Vacuum Annealing of Carbon Doped Silicon-Containing Films Silicon-containing films were deposited from the cyclic halocarbosilane 1,1,3,3-tetrachlorodisilacyclobutane precursor as described in Example 10. The films were deposited using ammonia process followed by an ex-situ annealing step in ambient atmosphere on a hot plate for 3 hours. Both deposition and annealing temperature were 300° C. In order to remove terminal hydroxyl groups in the film, the film was then vacuum annealed (<0.001 Torr) at 600° C. for 1 hour. The film thickness shrank by 9-10% and the refractive index dropped from 1.55 to 1.50. The IR spectra of the film shown in FIG. 2 shows the Si—OH band at 870 cm$^{-1}$ decreased after the vacuum anneal.

Example 16. PEALD of Carbon Doped Silicon-Containing Films

Silicon-containing films was deposited using the cyclic halocarbosilane 1,1,3,3-tetrachlorodisilacyclobutane precursor, ammonia, and an inert plasma at a 300° C. substrate temperature using a commercial PEALD reactor. The inert plasma was used to improve film density. Deposition steps provided in Table XV are as follows:

TABLE XV

| | Deposition steps and process parameters | | |
|---|---|---|---|
| Steps | Descriptions | Time | Notes |
| 1 | Insert Si substrates into a reactor | | |
| 2 | Heat substrates to desired temperature | 1 hour | T = 300° C. |
| 3 | Flow cyclic carbosilane precursor to the reactor | 1 second (s) | Chamber pressure = 3 Torr Vapor draw; Container pressure is between 14-18 Torr; Ar flow = 500 sccm |
| 4 | Purge cyclic carbosilane precursor out | 10 s | Ar = 1000 sccm |
| 5 | Flow NH$_3$ to the reactor | 25 s | NH$_3$ = 200 sccm; Ar = 500 sccm |
| 6 | Purge NH$_3$ out | 10 s | Ar = 1000 sccm |
| 7 | In-situ plasma densification | 300 s | Ar = 1000 sccm; plasma power = 200 W; 13.56 MHz, P = 3 Torr |
| 8 | Remove Si sample from the reactor | | |

Process steps 3 to 6 were repeated multiple times to get a desired film thickness, followed by step 7. The resulting film had a film density of 1.82 g/cc, a composition of 29.5% O, 14% N, 20.8% C, 34.6% Si, 1.1% Cl as measured by XPS, and a wet etch rate of 0.19 Å/s measured in dilute HF. It is believed that the high level of oxygen content in the film is likely due to exposure to ambient air.

Example 17. Step Coverage of Carbon Doped Silicon-Containing Films

Figure 3A:
FIGS. 3a through 3c provide cross section scanning electron microscope (SEM) images of deposited silicon-containing films, as described in Example 17.
Figure 3B:
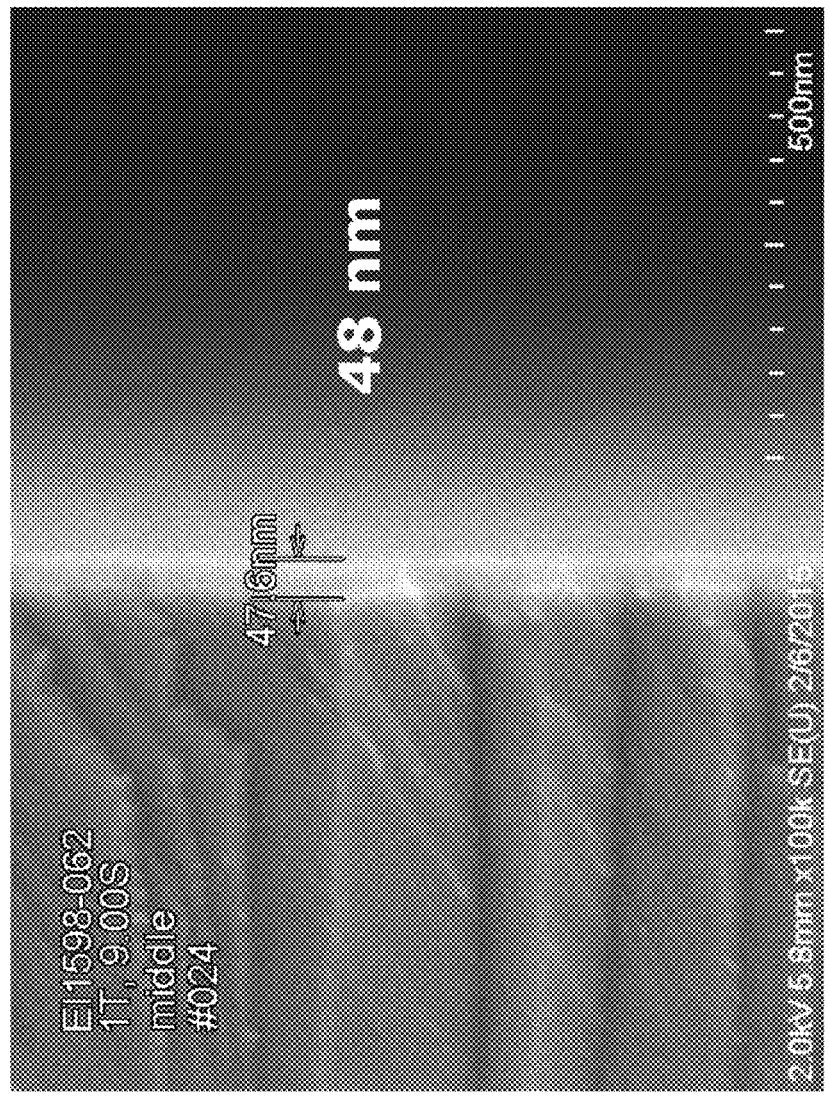
Figure 3C:
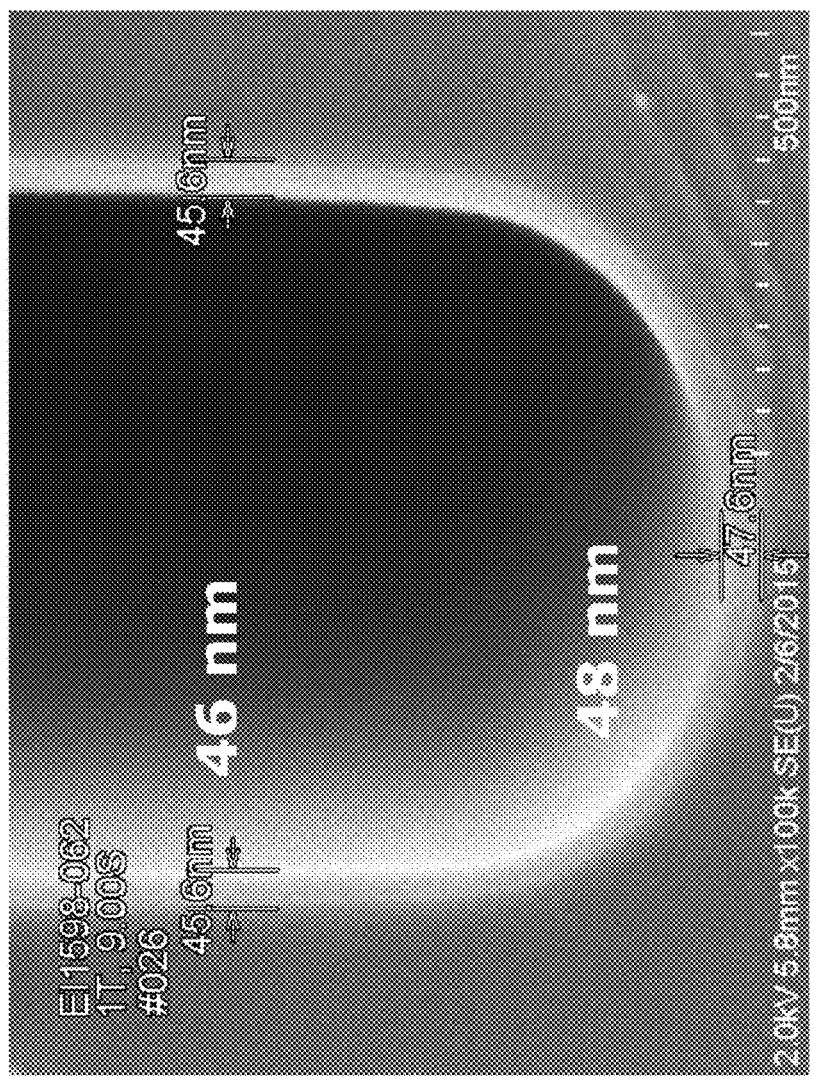

Silicon-containing films were deposited from the cyclic halocarbosilane precursor 1,1,3,3-tetrachlorodisilacyclobutane as described in Example 10 on a Si patterned wafer having a surface feature. The structure aspect ratio of the surface feature is 1:10 with 1 micron opening and 10 micron depth. Cross-sections were made of the deposited films which were examined under scanning electron microscopy as shown in FIGS. 3a through 3c. The aspect ratio of the surface feature was 1:10 (1 micron opening) (top) top of the structure shown in 3a, (middle) side wall of structure shown in 3b; and (bottom) bottom of the structure shown in 3c. The cross-sectional SEM images shows ~100% surface coverage of the film.

Example 18. Plasma Densification Treatment During ALD Deposition of Carbon Doped Silicon-Containing Film Silicon-containing films was deposited using the cyclic halocarbosilane precursor 1,1,3,3-tetrachlorodisilacyclobutane, ammonia and an inert plasma densification step at every ALD cycle at 300° C. substrate temperature, demonstrating that intermittent film treatments can improve certain properties of the resulting film, such as density. The deposition steps are provided in the following Table XVI:

TABLE XVI

| | Deposition steps and process parameters | | |
|---|---|---|---|
| Steps | Descriptions | Time | Notes |
| 1 | Insert Si substrates into a reactor | | |
| 2 | Heat substrates to desired temperature | 1 hour | T = 300° C. |
| 3 | Flow cyclic carbosilane precursor to the reactor | 1 second (s) | Chamber pressure = 3 Torr Vapor draw; Container pressure is between 14-18 Torr; Ar flow = 500 sccm |
| 4 | Purge cyclic carbosilane precursor out | 10 s | Ar = 1000 sccm |

TABLE XVI-continued

Deposition steps and process parameters

| Steps | Descriptions | Time | Notes |
|---|---|---|---|
| 5 | Flow NH₃ to the reactor | 25 s | NH₃ = 200 sccm; Ar = 500 sccm |
| 6 | Purge NH₃ out | 10 s | Ar = 1000 sccm |
| 7 | In-situ plasma densification using Ar plasma | 5 s | Ar = 1000 sccm; plasma power = 200 W; 13.56 MHz; Pressure = 3 Torr |
| 8 | Purge | 2 s | Ar = 1000 sccm |
| 9 | Remove Si sample from the reactor | | |

Process steps 3 to 8 in Table XVI were repeated 1000 times to get the desired thickness of silicon-containing films. The resulting film contained 7.1% O, 48.0% N, 5.3% C, 39.3% Si and 0.3% Cl as measured by XPS and had a relatively high density of 2.6 g/cc. It is believed that the high level of oxygen content in the film is likely due to exposure to ambient air.

Example 19. Carbon Doped Silicon-Containing Film Deposited Using Ethylenediamine in Thermal ALD Process Silicon-containing films were deposited from 1,1,3,3-tetrachloro-1,3-disilacyclobutane as the cyclic carbosilane precursor and ethylenediamine at a temperature of 300° C. The precursor was delivered using vapor draw at 70° C. source temperature while nitrogen source was delivered at 30° C. using vapor draw.

TABLE XVII

| Steps | Descriptions | Time | Notes |
|---|---|---|---|
| 1 | Insert Si substrates into a reactor | | |
| 2 | Heat substrates to desired temperature | ~1-2 hours | T = 300 |
| 3 | Close throttle valve | 2 seconds (s) | Throttle valve is closed to increase residence time |
| 4 | Deliver cyclic carbosilane precursor dose | 2 s | Vapor draw; vapor pressure is between 14-18 Torr |
| 5 | Deliver cyclic carbosilane precursor dose | 2 s | |
| 6 | Deliver cyclic carbosilane precursor dose | 2 s | After 3 doses of Si precursor, chamber pressure is ~150-250 mTorr |
| 7 | Open throttle valve | 2 s | |
| 8 | Flow N₂ to purge the reactor | 6 s | N₂ flow is 5 lpm |
| j9 | Evacuate the reactor to base pressure | 6 s | Base pressure is <1 mTorr |
| 10 | Close throttle valve | 2 s | Throttle valve is closed to increase residence time |
| 11 | Deliver ethylenediamine dose | 8 × 2 s | Ethylene diamine dose was delivered 8 times with 2 s in each dose. Chamber pressure is ~300 mTorr |
| 12 | Open throttle valve | | |
| 13 | Flow N₂ to purge the reactor | 6 s | N₂ flow is 5 lpm |
| 14 | Evacuate gas from the reactor to the base pressure | 6 s | Base pressure is <1 mTorr |
| 15 | Remove Si sample from the reactor | | |

Process steps 3 to 14 were repeated multiple times to reach a desired film thickness. The resultant film had a refractive index of 1.56. The film density was 1.55 g/cc. The film composition was 33.7% C, 6.4% N, 24.4% N, 34.3% O, 1.2% Cl, as measured by XRR and XPS. It is believed that the high level of oxygen content in the film is likely due to exposure to ambient air. The carbon content for ethylenediamine process (33.7% C) is higher than ammonia process (24.7% C).

Comparative Example 1. Silicon-Containing Film Deposited Using SiCl₄ and Ammonia Silicon-containing films were deposited from silicon tetrachloride (SiCl₄) instead of a cyclic carbosilane precursor and ammonia as the nitrogen source at 300° C. using the process steps described in Table IV. The resulting film had a thickness of 250 nm with refractive index of 1.70.

The film was completely etched out after 15 seconds in dilute HF, which translates to a very high etch rate or greater than 16.7 Å/s.

Comparative Example 2. Carbon Doped Silicon-Containing Film Deposited Using Bis(Trichlorosilyl)Methane and Ammonia Silicon-containing films were deposited from the precursor bis(trichlorosilyl)methane, a linear carbosilane, and ammonia as the nitrogen source at 300° C. and 500° C. using the process steps described in Table IV. The film was subjected to dilute HF approximately one week after deposition to obtain its wet etch rate. Table XVIII and XIX provides the compositional data, refractive index and wet etch rate (WER) of the films. Compared to the cyclic carbosilanes in Example 9, the films deposited using the linear carbosilane showed a much higher WER and a much lower carbon content.

TABLE XVIII

| Temperature (° C.) | % O | % N | % C | % Cl | % Si | dHF WER (Å/s) |
|---|---|---|---|---|---|---|
| 300 | 55.3% | 1.8% | 8.1% | ND | 34.9% | 0.15 |
| 500 | 32.5% | 20.4% | 13.0% | 0.3% | 33.9% | 0.14 |
| Thermal oxide | N/A | N/A | N/A | N/A | N/A | 0.49 |

TABLE XIX

Refractive index and wet etch rate of films deposited from bis(trichlorosilyl)methane and ammonia

| Deposition Temperature (° C.) | Ref. index As-deposited | Ref. Index prior to etch | Growth per cycle (Å/cycle) | Dilute HF WER (Å/s) |
|---|---|---|---|---|
| 300 | 1.66 | 1.60 | 0.2 | 0.15 |

Comparative Example 3. Carbon Doped Silicon-Containing Film Deposited Using Bis(Trichlorosilyl)Methane and Ammonia Followed by Ex-Situ Post Deposition Treatment Silicon-containing films were deposited from bis(trichlorosilyl)methane instead of cyclic carbosilane and ammonia at 300° C. using the process steps described in Table IV. The deposited film was then annealed ex-situ at ambient for 3 hours at 300° C. The resulting film had a composition of 57.9% O, 2.4% N, 11.9% C and 27.7% Si. The WER of the film in dilute HF was 0.17 Å/s. The carbon content is much lower and the WER is much higher compared to the films deposited with the cyclic carbosilane precursor sicj as those in Examples 9 and 10 under the same experimental conditions.

Comparative Example 4. Plasma Densification Treatment During ALD Deposition of Carbon Doped Silicon-Containing Film Using Bis(Trichlorosilyl)Methane (BTCSM)

Si containing films were deposited using bis(trichlorosilyl)methane, ammonia as a nitrogen source followed by in-situ inert plasma densification step at the end of ALD deposition. Process temperature was at 300° C. Deposition steps are described in Table XXI as follows:

TABLE XXI

Deposition steps and process parameters

| Steps | Descriptions | Time | Notes |
|---|---|---|---|
| 1 | Insert Si substrates into a reactor | | |
| 2 | Heat substrates to desired temperature | 1 hour | T = 300° C. |
| 3 | Flow BTCSM precursor to the reactor | 1 second (s) | Chamber pressure = 3 Torr Vapor draw; Container pressure is between 14-18 Torr; Ar flow = 500 sccm |
| 4 | Purge BTCSM precursor out | 10 s | Ar = 1000 sccm |
| 5 | Flow NH₃ to the reactor | 25 s | NH₃ = 200 sccm; Ar = 500 sccm |
| 6 | Purge NH₃ out | 10 s | Ar = 1000 sccm |
| 7 | Plasma densification | 300 s | Ar = 1000 sccm; plasma power = 200 W; 13.56 MHz |
| 8 | Remove Si sample from the reactor | | |

Process steps 3 to 6 were repeated multiple times, followed by step 7 to provide a desired thickness of silicon-containing films. The deposited film has a dilute HF WER higher than 9 Å/s which is much higher than the silicon-containing films from cyclic carbosilane in Example 16 under the same deposition conditions.

The invention claimed is:

1. A composition comprising at least one precursor selected from the group consisting of:
   a cyclic halocarbosilane selected from the group consisting of 1-chloro-1,3-disilacyclobutane, 1-bromo-1,3-disilacyclobutane, 1-iodo-1,3-disilacyclobutane, 1,3-dichloro-1,3-disilacyclobutane, 1,3-dibromo-1,3-disilacyclobutane, 1,3-diiodo-1,3-disilacyclobutane, 1,1-dichloro-1,3-disilacyclobutane, 1,1-dibromo-1,3-disilacyclobutane, 1,1-diiodo-1,3-disilacyclobutane, 1,1,3,3-tetrabromo-1,3-disilacyclobutane, 1,1,3,3-tetraiodo-1,3-disilacyclobutane, 1,3-dichloro-1,3-dimethyl-1,3-disilacyclobutane, 1,1,3,3,5,5-hexachloro-1,3,5-trisilacyclohexane, 1,1,3,3,5,5-tetrachloro-1,3,5-trisilacyclohexane, and 1,3,5-trichloro-1,3,5-trisilacyclohexane;
   a cyclic haloaminocarbosilane selected from the group consisting of 1,3-bis(dimethylamino)-1,3-dichloro-1,3-disilacyclobutane, 1,3-bis(diethylamino)-1,3-dichloro-1,3-disilacyclobutane, and 1-(dimethylamino)-1,3,3-trichloro-1,3-disilacyclobutane; and
   a cyclic aminocarbosilane selected from the group consisting of 1,1,3,3-tetrakis(methylamino)-1,3-disilacyclobutane, 1,1,3,3-tetrakis(dimethylamino)-1,3-disilacyclobutane, 1,3-bis(dimethylamino)-1,3-dimethyl-1,3-disilacyclobutane, 1,3-bis(methylamino)-1,3-dimethyl-1,3-disilacyclobutane, and 1,3-bis(isopropylamino)-1,3-dimethyl-1,3-disilacyclobutane.

2. A method for depositing a carbon doped silicon containing film selected from a carbon doped silicon oxide film and a carbon doped silicon oxynitride film, the method comprising:
   placing a substrate into a reactor;
   heating the reactor to one or more temperatures ranging from about 100° C. to about 700° C.;

introducing at least one cyclic carbosilane precursor selected from the group consisting of a cyclic halocarbosilane, a cyclic haloaminocarbosilane, a cyclic aminocarbosilane and combinations thereof;
introducing a nitrogen source under conditions sufficient to react with the at least one cyclic carbosilane precursor and form a carbon doped silicon nitride film; and
optionally exposing the silicon carbonitride film to an oxygen source to convert the silicon carbonitride film to the film at one or more temperatures ranging from about 100° C. to 1000° C.

3. The method of claim 2 further comprising treating the silicon containing film with at least one selected from the group consisting of annealing, a plasma, ultraviolet light exposure, laser exposure, electron beam exposure, and combinations thereof.

4. The method of claim 2 wherein the cyclic carbosilane comprises the cyclic halocarbosilane selected from the group consisting of 1-chloro-1,3-disilacyclobutane, 1-bromo-1,3-disilacyclobutane, 1-iodo-1,3-disilacyclobutane, 1,3-dichloro-1,3-disilacyclobutane, 1,3-dibromo-1,3-disilacyclobutane, 1,3-diiodo-1,3-disilacyclobutane, 1,1-dichloro-1,3-disilacyclobutane, 1,1-dibromo-1,3-disilacyclobutane, 1, 1-diiodo-1,3-disilacyclobutane, 1,1,3,3-tetrachloro-1,3-disilacyclobutane, 1,1,3,3-tetrabromo-1,3-disilacyclobutane, 1,1,3,3-tetraiodo-1,3-disilacyclobutane, 1,3-dichloro-1,3-dimethyl-1,3-disilacyclobutane, 1,1,3,3,5,5-hexachloro-1,3,5-trisilacyclohexane, 1,1,3,3-tetrachloro-1,3,5-trisilacyclohexane, and 1,3,5-trichloro-1,3,5-trisilacyclohexane.

5. The method of claim 2 wherein the cyclic carbosilane comprises the cyclic haloaminocarbosilane selected from the group consisting of 1,3-bis(dimethylamino)-1,3-dichloro-1,3-disilacyclobutane, 1,3-bis(diethylamino)-1,3-dichloro-1,3-disilacyclobutane, and 1-(dimethylamino)-1,3,3-trichloro-1,3-disilacyclobutane.

6. The method of claim 2 wherein the cyclic carbosilane comprises the cyclic aminocarbosilane selected from the group consisting of 1,1,3,3-tetrakis(methylamino)-1,3-disilacyclobutane, 1,1,3,3-tetrakis(dimethylamino)-1,3-disilacyclobutane, 1,3-bis(dimethylamino)-1,3-dimethyl-1,3-disilacyclobutane, 1,3-bis(methylamino)-1,3-dimethyl-1,3-disilacyclobutane, and 1,3-bis(iso-propylamino)-1,3-dimethyl-1,3-disilacyclobutane.

7. The method of claim 2 wherein the film comprises a carbon content of about 10 atomic weight % or greater as measured by XPS.

8. The method of claim 2 wherein the film comprises a wet etch of about 0.15 Å/s or less as measured by dilute hydrofluoric acid.

9. A method for depositing a silicon containing film selected from a silicon carbide film and a carbon doped silicon nitride film, the method comprising:
placing a semi-conductor substrate into a reactor;
heating the reactor to one or more temperatures ranging from about 100° C. to about 700° C. and optionally maintaining the reactor at a pressure of 100 torr or less;
introducing at least one cyclic carbosilane selected from the group consisting of a cyclic halocarbosilane, a cyclic haloaminocarbosilane, and combinations thereof;
introducing into the reactor a nitrogen-containing plasma source under conditions sufficient to react with the carbosilane precursor and form the film.

10. The method of claim 9 wherein the nitrogen-containing plasma source is selected from the group consisting of nitrogen plasma, a plasma comprising nitrogen and helium, a plasma comprising nitrogen and argon, ammonia plasma, a plasma comprising ammonia and helium, a plasma comprising ammonia and argon, helium plasma, argon plasma, neon plasma, hydrogen plasma, a plasma comprising hydrogen and helium, a plasma comprising hydrogen and argon, an organic amine plasma, organic diamine plasma, and combinations thereof.

11. The method of claim 9 further comprising treating the silicon containing film with at least one selected from the group consisting of annealing, a plasma treatment, ultraviolet light exposure, laser exposure, electron beam exposure, and combinations thereof.

12. The method of claim 9 further comprising exposing the film to an oxygen source into the reactor to convert the silicon containing film into a silicon oxide or carbon doped silicon oxide films.

13. The method of claim 12 wherein the oxygen source is selected from the group consisting of water vapor, water plasma, oxygenated water, oxygenated water steam, oxygen, oxygen plasma, a plasma comprising oxygen and helium, a plasma comprising oxygen and argon plasma, a plasma comprising a nitrogen oxide, a plasma comprising carbon dioxide, hydrogen peroxide, organic peroxides, and combinations thereof.

14. The method of claim 12 wherein the cyclic carbosilane comprises the cyclic halocarbosilane selected from the group consisting of 1-chloro-1,3-disilacyclobutane, 1-bromo-1,3-disilacyclobutane, 1-iodo-1,3-disilacyclobutane, 1,3-dichloro-1,3-disilacyclobutane, 1,3-dibromo-1,3-disilacyclobutane, 1,3-diiodo-1,3-disilacyclobutane, 1,1-dichloro-1,3-disilacyclobutane, 1,1-dibromo-1,3-disilacyclobutane, 1, 1-diiodo-1,3-disilacyclobutane, 1,1,3,3-tetrachloro-1,3-disilacyclobutane, 1,1,3,3-tetrabromo-1,3-disilacyclobutane, 1,1,3,3-tetraiodo-1,3-disilacyclobutane, 1,3-dichloro-1,3-dimethyl-1,3-disilacyclobutane, 1,1,3,3,5,5-hexachloro-1,3,5-trisilacyclohexane, 1,1,3,3-tetrachloro-1,3,5-trisilacyclohexane, and 1,3,5-trichloro-1,3,5-trisilacyclohexane.

15. The method of claim 12 wherein the cyclic carbosilane comprises the cyclic haloaminocarbosilane selected from the group consisting of 1,3-bis(dimethylamino)-1,3-dichloro-1,3-disilacyclobutane, 1,3-bis(diethylamino)-1,3-dichloro-1,3-disilacyclobutane, and 1-(dimethylamino)-1,3,3-trichloro-1,3-disilacyclobutane.

16. A method for depositing a carbon doped silicon oxide film, the method comprising:
placing a substrate into a reactor;
introducing at least one cyclic carbosilane precursor having the following Formulae I and II:

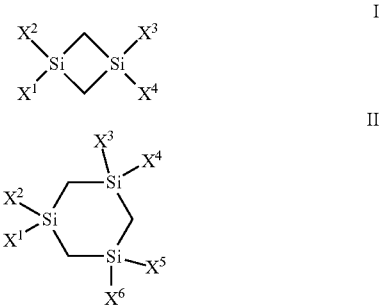

wherein $X^1$, $X^5$, and $X^6$ are each independently chosen from a hydrogen atom; a halide atom selected from F, Cl, Br, and I; an amino group having the formula $NR^1R^2$ wherein $R^1$ and $R^2$ are independently selected from the group consisting of a hydrogen atom, a $C_1$ to $C_{10}$ linear alkyl group; a $C_3$ to $C_{10}$ branched alkyl group; a $C_3$ to $C_{10}$ cyclic alkyl group; a $C_3$ to $C_{10}$ alkenyl group; a $C_4$ to $C_{10}$ aryl group; and a $C_4$ to $C_{10}$ heterocyclic group;

introducing a nitrogen source under conditions sufficient to react with the at least one cyclic carbosilane precursor and form a carbon doped silicon nitride film; and, exposing the carbon doped silicon nitride film to an oxygen source under conditions sufficient to convert the carbon doped silicon nitride film to the carbon doped silicon oxide film.

17. The method of claim 16 wherein the precursor comprises Formulae I and $X^1$, $X^2$, $X^3$ and $X^4$ are Cl.

18. The method of claim 16 wherein the exposing comprises thermal annealing the carbon doped silicon nitride film in the presence of the oxygen source.

19. The method of claim 18 wherein the oxygen source comprises at least one of air and water.

20. The method of claim 16 further comprising treating the silicon doped silicon oxide film with a hydrogen containing plasma.

\* \* \* \* \*